(12) United States Patent
Takagi et al.

(10) Patent No.: US 10,650,973 B2
(45) Date of Patent: May 12, 2020

(54) METHOD OF MANUFACTURING MULTILAYER CERAMIC ELECTRONIC COMPONENT

(71) Applicant: Murata Manufacturing Co., Ltd., Nagaokakyo-shi, Kyoto-fu (JP)

(72) Inventors: Yuya Takagi, Nagaokakyo (JP); Togo Matsui, Nagaokakyo (JP); Hikaru Okuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 538 days.

(21) Appl. No.: 15/158,691

(22) Filed: May 19, 2016

(65) Prior Publication Data

US 2016/0351334 A1    Dec. 1, 2016

(30) Foreign Application Priority Data

May 25, 2015  (JP) .................. 2015-105356

(51) Int. Cl.
  *H01G 7/00*   (2006.01)
  *H01G 4/30*   (2006.01)
  *H01G 4/12*   (2006.01)
  *H01L 41/273* (2013.01)

(52) U.S. Cl.
  CPC .............. *H01G 4/30* (2013.01); *H01G 4/12* (2013.01); *H01L 41/273* (2013.01); *Y10T 29/435* (2015.01)

(58) Field of Classification Search
  CPC ............ H01G 4/30; H01G 4/12; H01G 4/232; H01G 4/40; H01G 4/06; Y10T 29/435; Y10T 156/1052

USPC .............. 29/25.42, 25.03, 25.41, 623.5, 832
  See application file for complete search history.

(56) References Cited

U.S. PATENT DOCUMENTS

| 8,795,454 B2 * | 8/2014 | Matsui .................... H01G 4/12 156/89.12 |
| 9,865,395 B2 * | 1/2018 | Tanaka .................... H01G 4/30 |
| 2014/0345779 A1 | 11/2014 | Matsui et al. |

FOREIGN PATENT DOCUMENTS

| JP | 10-135068 A | 5/1998 |
| JP | H10135068 | * 5/1998 |
| JP | 2000-100655 A | 4/2000 |

(Continued)

OTHER PUBLICATIONS

Official Communication issued in Japanese Patent Application No. 2015-105356, dated Dec. 18, 2018.

*Primary Examiner* — Thiem D Phan
(74) *Attorney, Agent, or Firm* — Keating & Bennett, LLP

(57) ABSTRACT

A method of manufacturing a multilayer ceramic electronic component includes preparing a green mother laminate in which ceramic layers and inner electrode layers are stacked; cutting the mother laminate perpendicularly or substantially perpendicularly to a main surface of the mother laminate and in a first direction when the mother laminate is viewed in plan such that first sectional surfaces are formed, and pressing the mother laminate to obtain a bonded laminate in which the first sectional surfaces are bonded to each other; and separating the bonded laminate between the first sectional surfaces to obtain laminates. Then, the bonded laminate is cut perpendicularly or substantially perpendicularly to the main surface and in a second direction that intersects the first sectional surfaces such that second sectional surfaces are formed.

9 Claims, 19 Drawing Sheets

(56) References Cited

FOREIGN PATENT DOCUMENTS

JP         2000-269104 A    9/2000
KR    10-2014-0097062 A    8/2014

* cited by examiner

METHOD OF MANUFACTURING MULTILAYER CERAMIC ELECTRONIC COMPONENT

BACKGROUND OF THE INVENTION

1. Field of the Invention

The present invention relates to a method of manufacturing a ceramic electronic component, and, in particular, to a method of manufacturing a multilayer ceramic electronic component includes inner electrode layers are stacked with ceramic layers interposed therebetween.

2. Description of the Related Art

A well-known method of manufacturing a multilayer ceramic capacitor, which is a typical example of a multilayer ceramic electronic component, includes a step of forming a mother laminate in which inner electrode layers are stacked with ceramic layers interposed therebetween, a step of pressing the mother laminate, and a step of cutting the mother laminate into individual chips (ceramic capacitor elements).

However, this method has the following problem. In the step of pressing the mother laminate, deformation of the inner electrode layers may occur. Therefore, when the mother laminate is cut into individual chips, gaps between the peripheries, excluding extended portions, of the internal electrode layers and side surfaces or end surfaces of the chips may become insufficient. As a result, reliability in insulation from the outside may decrease.

To address the problem, Japanese Unexamined Patent Application Publication No. 10-135068 describes the following method of manufacturing a multilayer ceramic electronic component.

That is, as shown in FIGS. 2 to 4 and described in paragraphs [0016] to [0024] of Japanese Unexamined Patent Application Publication No. 10-135068, the method includes placing a mother block on an expandable film, cutting the mother block into a plurality of cut blocks before pressing the mother block, expanding the expandable film in an in-plane direction thereof to form gaps between the cut blocks, filling the gaps with a filler that is a mixture of powder and liquid, evaporating the liquid to solidify the filler, pressing the cut blocks together with the filler, and removing the filler to obtain the cut blocks, which are raw chips.

It is described that, by using this method, the occurrence of undesirable deformation of the mother block and the occurrence of displacement and deformation of the inner electrode layers in the pressing step can be suppressed or prevented.

However, with the method of manufacturing a multilayer ceramic electronic component described in Japanese Unexamined Patent Application Publication No. 10-135068, if the filler remains between the cut blocks (chips), the filler may be diffused in the cut blocks when firing the cut blocks, and therefore the electric characteristics and the reliability of the multilayer ceramic electronic component may be negatively affected.

Moreover, due to the presence of the filler, even a ceramic material included in the chips may be melted, and the electric characteristics and the reliability of the multilayer ceramic electronic component may be impaired.

SUMMARY OF THE INVENTION

Accordingly, preferred embodiments of the present invention provide a method of manufacturing a multilayer ceramic electronic component with which it is possible to efficiently and reliably manufacture a multilayer ceramic electronic component that has good electric characteristics and high reliability.

According to a preferred embodiment of the present invention, a method of manufacturing a multilayer ceramic electronic component includes a bonded laminate forming step including cutting a green mother laminate, in which ceramic layers and inner electrode layers are stacked, in such a way that first sectional surfaces, which intersect a main surface of the green mother laminate, are formed, and after cutting, pressing the cut green mother laminate to obtain the bonded laminate in which the first sectional surfaces are bonded to each other; and a separating step of separating the bonded laminate between the first sectional surfaces, which have been bonded to each other, to obtain separated laminates.

Preferably, the method further includes, after performing the bonded laminate forming step, a step of cutting the bonded laminate in such a way that second sectional surfaces, which intersect the main surface and the first sectional surfaces, are formed.

In this case, it is possible to obtain individual laminates efficiently by dividing the mother laminate in a matrix pattern while suppressing deformation and displacement of the inner electrode layers.

Preferably, in the method, the bonded laminate forming step further includes, after cutting the green mother laminate in such a way that the first sectional surfaces are formed and before pressing the green mother laminate, cutting the green mother laminate in such a way that second sectional surfaces, which intersect the main surface and the first sectional surfaces, are formed; and pressing the cut green mother laminate to obtain the bonded laminates in which the first sectional surfaces are bonded to each other and the second sectional surfaces are bonded to each other.

In this case, all cutting operations have been finished before performing a pressing operation that may cause deformation and displacement of the inner electrode layers. Therefore, it is possible to obtain laminates in which deformation and displacement of the inner electrode layers are suppressed or prevented.

Preferably, in the separating step, the bonded laminate is separated between the first sectional surfaces, which have been bonded to each other, by moving a dividing jig relative to the bonded laminate along a main surface of the bonded laminate while pressing the dividing jig against the main surface of the bonded laminate.

In this case, it is possible to obtain separated laminates, which are separated at the first sectional surfaces, by efficiently separating the bonded laminate between the first sectional surfaces by moving the pressing jig relative to the bonded laminate along the main surface of the bonded laminate while pressing the pressing jig. As a result, the advantages of preferred embodiments of the present invention are more effectively obtained.

Preferably, in the separating step, the bonded laminate is separated either or both of between the first sectional surfaces and between the second sectional surfaces by moving a dividing jig relative to the bonded laminate along a main surface of the bonded laminate while pressing the dividing jig against the main surface of the bonded laminate.

In this case, it is possible to obtain individual laminates by efficiently dividing the bonded laminate. As a result, the advantages of preferred embodiments of the present invention are more effectively obtained.

Preferably, the method further includes a step of applying a functional member to either or both of the first sectional surfaces and second sectional surfaces intersecting the main surface of the mother laminate and the first sectional surfaces, of the laminates obtained by separating the bonded laminate in the separating step.

In this case, the functional member is applied to either or both of the first sectional surfaces and the second sectional surfaces of each of the laminates obtained by separating the bonded laminate between the sectional surfaces. Therefore, for example, it is possible to efficiently manufacture a multilayer ceramic electronic component including outer electrodes connected to the inner electrode layers and a multilayer ceramic electronic component including side gaps having a predetermined thickness.

Preferably, in the method, the laminates obtained in the separating step each include inner electrode layers and ceramic layers that are alternately stacked; one of each pair of the inner electrode layers that are adjacent to each other in a stacking direction is exposed at one of a pair of the first sectional surfaces that oppose each other and the other of the pair of the inner electrode layers that are adjacent to each other in the stacking direction is exposed at the other of the pair of the first sectional surfaces; and the method further includes a step of applying an electrode material as the functional member to the pair of the first sectional surfaces.

In this case, for example, it is possible to efficiently manufacture a multilayer ceramic electronic component, such as a multilayer ceramic capacitor, in which the inner electrode layers, which are stacked with the ceramic layers interposed therebetween, alternately extend to one and the other of a pair of end surfaces and are connected to outer electrodes formed on the pair of end surfaces.

Preferably, in the method, the laminates obtained in the separating step each include inner electrode layers and ceramic layers that are alternately stacked; one of each pair of the inner electrode layers that are adjacent to each other in a stacking direction is exposed at one of a pair of the first sectional surfaces that oppose each other, the other of the pair of inner electrode layers that are adjacent to each other in the stacking direction is exposed at the other of the pair of the first sectional surfaces, and all the inner electrode layers that are stacked are exposed at each of a pair of the second sectional surfaces that intersect the first sectional surfaces and that oppose each other; and the method further includes a step of applying an insulating material as the functional member to the second sectional surfaces of the laminates.

In this case, for example, it is possible to efficiently manufacture a multilayer ceramic electronic component (such as a multilayer ceramic capacitor) having high reliability and having the following structure: the inner electrode layers, which are stacked with the ceramic layers interposed therebetween, alternately extend to one and the other of a pair of end surfaces and are connected to outer electrodes formed on the pair of end surfaces; and the insulating material is applied to the pair of end surface (the second sectional surfaces) of the multilayer electronic component to provide sufficient side gaps.

Preferably, in the method, the laminates obtained in the separating step each include inner electrode layers and ceramic layers that are alternately stacked; the inner electrode layers are not exposed at the first sectional surfaces; one of each pair of the inner electrode layers that are adjacent to each other in a stacking direction is exposed at one of a pair of the second sectional surfaces that oppose each other and the other of the pair of the inner electrode layers that are adjacent to each other in the stacking direction is exposed at the other of the pair of the second sectional surfaces; and the method further includes a step of applying an electrode material as the functional member to the second sectional surfaces of the laminates.

In this case, it is possible to efficiently manufacture a multilayer ceramic electronic component having a structure in which one of each pair of the inner electrode layers that are adjacent to each other in the stacking direction is exposed at one of each pair of end surfaces that oppose each other and the other of the pair of the inner electrode layers that are adjacent to each other in the stacking direction is exposed at the other of the pair of end surfaces.

According to a preferred embodiment of the present invention, a method of manufacturing a multilayer ceramic electronic component includes a bonded laminate forming step including cutting a green mother laminate, in which ceramic layers and inner electrode layers are stacked, in such a way that first sectional surfaces, which intersect a main surface of the green mother laminate, are formed to obtain a plurality of laminates each having a structure in which one of each pair of the inner electrode layers that are adjacent to each other in a stacking direction is exposed at one of a pair of the first sectional surfaces that oppose each other and the other of the pair of the inner electrode layers that are adjacent to each other in the stacking direction is exposed at the other of the pair of the first sectional surfaces, and pressing the plurality of laminates to obtain a bonded laminate in which the first sectional surfaces are bonded to each other; a step of cutting the bonded laminate in such a way that second sectional surfaces, which intersect the main surface and the first sectional surfaces, are formed to obtain laminates each having a structure in which all the inner electrode layers that are stacked alternately with the ceramic layers are exposed at each of a pair of the second sectional surfaces; and a step of applying an insulating material as a protective member to the second sectional surfaces of the laminates.

Preferably, the method further includes a separating step of separating, before performing the step of applying the insulating material, the bonded laminate between the first sectional surfaces.

In this case, by separating the bonded laminate between the first sectional surfaces before applying the insulating material, it is possible to avoid the risk of damaging the protective layer, which is made of the insulating material, and to divide the bonded laminate without fail.

Preferably, the method further includes a separating step of separating, after performing the step of applying the insulating material, the bonded laminate between the first sectional surfaces.

In this case, by applying the insulating material before separating the bonded laminate between the first sectional surfaces, it is possible to efficiently apply the insulating material and to improve productivity.

According to a preferred embodiment of the present invention, a method of manufacturing a multilayer ceramic electronic component includes a step of cutting a green mother laminate, in which ceramic layers and inner electrode layers are stacked, in such a way that first sectional surfaces, which intersect a main surface of the green mother laminate, are formed to obtain separated laminates; and a step of pressing the separated laminates in a state in which the first sectional surfaces of the separated laminates that are adjacent to each other are in contact with each other.

A method of manufacturing a multilayer ceramic electronic component according to a preferred embodiment of the present invention includes a bonded laminate forming step including cutting a green mother laminate, in which ceramic layers and inner electrode layers are stacked, in such a way that first sectional surfaces, which intersect a main surface of the green mother laminate, are formed, and pressing the green mother laminate to obtain a bonded laminate in which the first sectional surfaces are bonded to each other; and a separating step of separating the bonded laminate between the first sectional surfaces, which have been bonded to each other, to obtain laminates. Therefore, it is possible to obtain individual laminates (chips) in which deformation and displacement of the inner electrode layers are reduced, and it is possible to manufacture a multilayer ceramic electronic component having high reliability.

That is, by cutting the mother laminate before pressing the mother laminate, it is possible to suppress or prevent deformation and displacement of the inner electrode layers due to pressing, and it is possible to manufacture a multilayer ceramic electronic component having high reliability with a high yield ratio.

In a preferred embodiment of the present invention, the bonded laminate, in which the first sectional surfaces are bonded to each other, is obtained by cutting the mother laminate in a first direction in such a way that the first sectional surfaces are formed and then by pressing the mother laminate. In the step of pressing the mother laminate, pressing may be performed in any of the following ways: (a) the mother laminate is pressed under such conditions that the first sectional surfaces can be bonded to each other and the ceramic layers and the inner electrode layers of the laminate are sufficiently pressure-bonded to each other; and (b) the mother laminate is pressed under conditions that prioritize bonding the first sectional surfaces to each other to obtain the bonded laminate and then pressing the bonded laminate under such conditions that the ceramic layers and the inner electrode layers of the laminate are sufficiently pressure-bonded to each other.

Another method of manufacturing a multilayer ceramic electronic component according to a preferred embodiment of the present invention includes cutting a green mother laminate perpendicularly or substantially perpendicularly to the main surface of the mother laminate and in a first direction when the mother laminate is viewed in plan in such a way that first sectional surfaces are formed to obtain a plurality of laminates each having a structure in which the inner electrode layers that are adjacent to each other in the stacking direction alternately extend to one and the other of the first sectional surfaces that oppose each other; pressing the plurality of laminates to obtain a bonded laminate in which the first sectional surfaces of the laminates are bonded to each other; cutting the bonded laminate in such a way that the second sectional surfaces, which intersect the main surface and the first sectional surfaces, are formed to obtain individual laminates each having a structure in which all the inner electrode layers that are stacked alternately with the ceramic layers are exposed at each of the second sectional surfaces that intersect the first sectional surfaces; and applying the insulating material as a protective member to the second sectional surfaces. Therefore, for example, it is possible to efficiently manufacture a multilayer ceramic electronic component, such as a multilayer ceramic capacitor, having the following structure: the inner electrode layers, which are stacked with the ceramic layers interposed therebetween, alternately extend to one and the other of the pair of end surfaces (the first sectional surfaces) and are connected to outer electrodes formed on the pair of end surfaces; and the insulating material is applied to a pair of side surfaces (the second sectional surfaces) to provide sufficient side gaps.

Still another method of manufacturing a multilayer ceramic electronic component according to a preferred embodiment of the present invention includes cutting a green mother laminate, in which ceramic layers and inner electrode layers are stacked, in such a way that first sectional surfaces, which intersect the main surface of the green mother laminate, are formed to obtain separated laminates; and pressing the separated laminates in a state in which the first sectional surfaces of the separated laminates that are adjacent to each other are in contact with each other. Also in this case, it is possible to suppress or prevent deformation of the inner electrode layers and to efficiently manufacture a multilayer ceramic electronic component having good characteristics.

That is, although work efficiency can be improved by pressing the bonded laminate, it is not necessary to bond the first sectional surfaces to each other or the second sectional surfaces to each other when pressing the bonded laminate. Alternatively, the separated laminates or the individual laminates may be pressed in a state in which the first sectional surfaces are in contact with each other or the second sectional surfaces are in contact with each other. Also in this case, it is possible to suppress or prevent deformation and displacement of the inner electrode layers due to pressing, and it is possible to manufacture a multilayer ceramic electronic component having high reliability with a high yield ratio.

When continuous inner electrode layers are cut to so as to expose the second sectional surfaces, the problem of displacement and deformation of the inner electrode layers is not likely to occur. In contrast, when cutting positions between the inner electrode layers so as to expose the first sectional surfaces, the problem of displacement and deformation of the inner electrode layers is likely to occur. Therefore, the risk of causing trouble is reduced or prevented by performing cutting so as to expose the first sectional surfaces before pressing and by performing cutting so as to expose the second sectional surfaces after pressing. Thus, it is possible to efficiently manufacture a multilayer ceramic electronic component having high reliability.

The above and other elements, features, steps, characteristics and advantages of the present invention will become more apparent from the following detailed description of the preferred embodiments with reference to the attached drawings.

DESCRIPTION OF THE PREFERRED EMBODIMENTS

Hereinafter, preferred embodiments of the present invention will be described in detail.

First Preferred Embodiment

In a first preferred embodiment of the present invention, an example in which a multilayer ceramic capacitor is manufactured as a multilayer ceramic electronic component will be described.

First, a green mother laminate 1, having a structure in which ceramic layers and inner electrode layers are stacked, is prepared. The mother laminate 1 includes electrode-pattern sheets and non-electrode-pattern sheets that are stacked in a predetermined order. Each of the electrode-pattern sheets has inner electrode patterns formed by applying a conductive paste to a ceramic green sheet made of dielectric ceramic. The non-electrode-pattern sheets do not have inner electrode patterns.

The electrode-pattern sheets, each having rectangular or substantially rectangular inner electrode patterns arranged in a matrix shape, are stacked in such a way that the positions of the inner electrode patterns are alternately displaced from each other layer by layer. Therefore, by cutting the mother laminate 1, it is possible to obtain individual laminates, each having a structure in which the inner electrode layers alternately extend to one and the other of a pair of end surfaces (first sectional surfaces) as described below.

Figure 1:
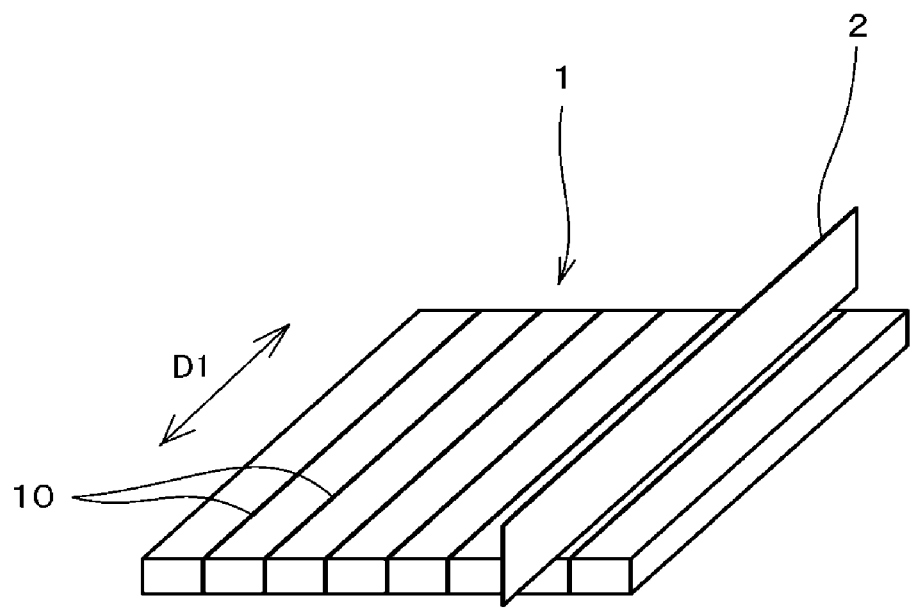
FIG. 1 illustrates a step of cutting a green mother laminate in a first direction in a first preferred embodiment of the present invention.

As illustrated in FIG. 1, the green mother laminate 1 is press-cut by pressing a cutting blade 2 into the mother laminate 1 perpendicularly or substantially perpendicularly to the main surface of the mother laminate 1 and along a first direction D1 when the mother laminate 1 is viewed in plan. Although the green mother laminate 1 may be cut by using a dicing method, preferably, the green mother laminate 1 is press-cut so that sectional surfaces can be made to contact each other easily and bonded to each other easily. Thus, the mother laminate 1 is cut in such a way that first sectional surfaces 10, which intersect the main surface, are formed. As a result, the mother laminate 1 becomes a set of separated laminates, each having a thin rectangular or substantially rectangular bar shape.

Figure 2:
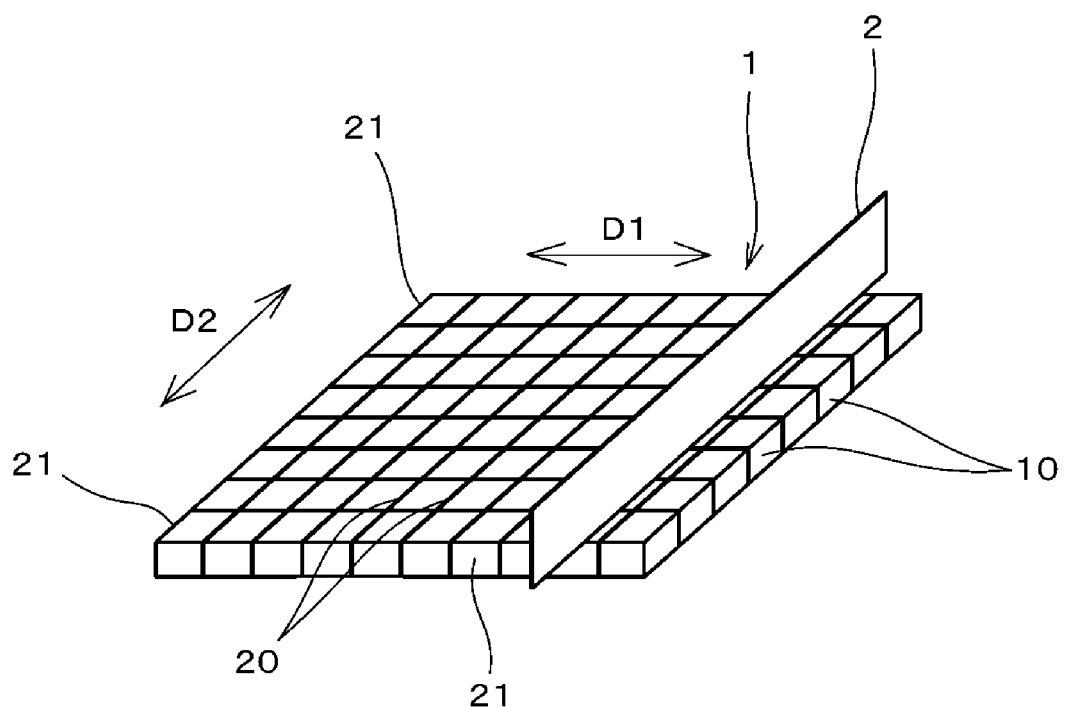
FIG. 2 illustrates a step of cutting the green mother laminate in a second direction that (perpendicularly or substantially perpendicularly) intersects the first direction in the first preferred embodiment of the present invention.

Next, as illustrated in FIG. 2, the mother laminate 1 (a set of separated laminates), which has been cut as described above, is cut perpendicularly or substantially perpendicularly to the main surface and in a second direction D2 intersecting (in the present preferred embodiment, substantially perpendicularly intersecting) the first sectional surfaces 10. Thus, the mother laminate 1 is cut in such a way that second sectional surfaces 20, which intersect the main surface and the first sectional surfaces 10, are formed. As a result, the mother laminate 1 becomes a set of individual laminates 21, each including the first and second sectional surfaces 10 and 20.

The set of the individual laminates 21 is heated (preferably, (preliminarily) pressed and heated), while maintaining the arrangement of the individual laminates 21, to bond the first sectional surfaces 10 of the individual laminate 21 to each other and the second sectional surfaces 20 of the individual laminate 21 to each other. Thus, a bonded laminate 31 (the mother laminate 1), in which the individual laminates 21 are bonded to each other at the first sectional surfaces 10 and the second sectional surfaces 20, is obtained. By impregnating the laminate with a binder beforehand, the first sectional surfaces 10 and the second sectional surfaces 20 can be easily bonded to each other.

Figure 3A:
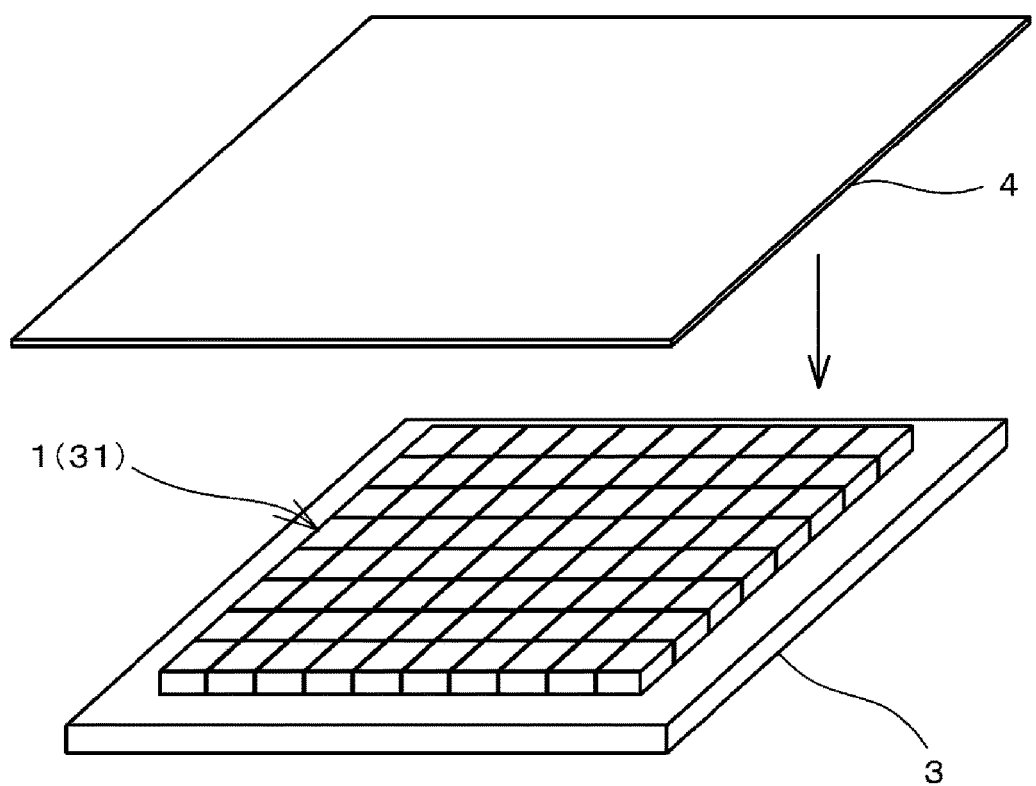
FIGS. 3A and 3B illustrate a method of pressing the green mother laminate, which has been cut, in the first preferred embodiment of the present invention.
Figure 3B:
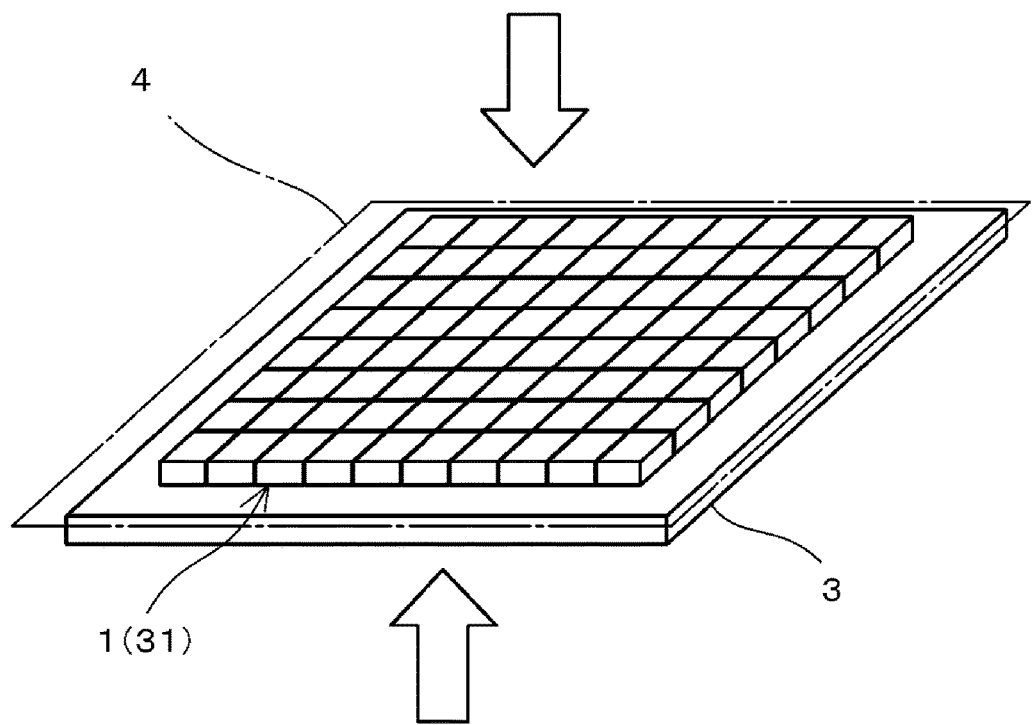

Next, the bonded laminate 31 is set on a die 3 as illustrated in FIG. 3A, and an upper cover 4 is placed on the bonded laminate 31 as illustrated in FIG. 3B. By hydrostatically pressing the entirety of the bonded laminate 31, a set of the individual laminates 21 is obtained. In each of the individual laminates 21, the ceramic layers and the inner electrode layers are pressure-bonded to each other securely.

When pressing the bonded laminate 31, an elastic rubber sheet or a protective film may be placed on the upper surface or the lower surface of the bonded laminate 31. Pressing may be performed without using a die. Pressing may be performed by using a dry-pressing method (such as servo pressing or hydraulic pressing).

In the present preferred embodiment, in the step (3), heating is performed (preferably, pressing and heating are performed) to obtain the bonded laminate 31, in which the individual laminates 21 are bonded to each other at the first sectional surfaces 10 and the second sectional surfaces 20. Then, in the step (4), hydrostatic pressing is performed to pressure-bond the ceramic layers and the inner electrode layers of the bonded laminate 31 to each other securely. However, the steps (3) and (4) may be performed in a single step.

Although work efficiency can be improved by pressing the bonded laminate 31, it is not necessary to bond the first sectional surfaces 10 to each other or the second sectional surfaces 20 to each other. Alternatively, the separated laminates or the individual laminates may be pressed in a state in which the first sectional surfaces 10 are in contact with each other or the second sectional surfaces 20 are in contact with each other.

Figure 4:
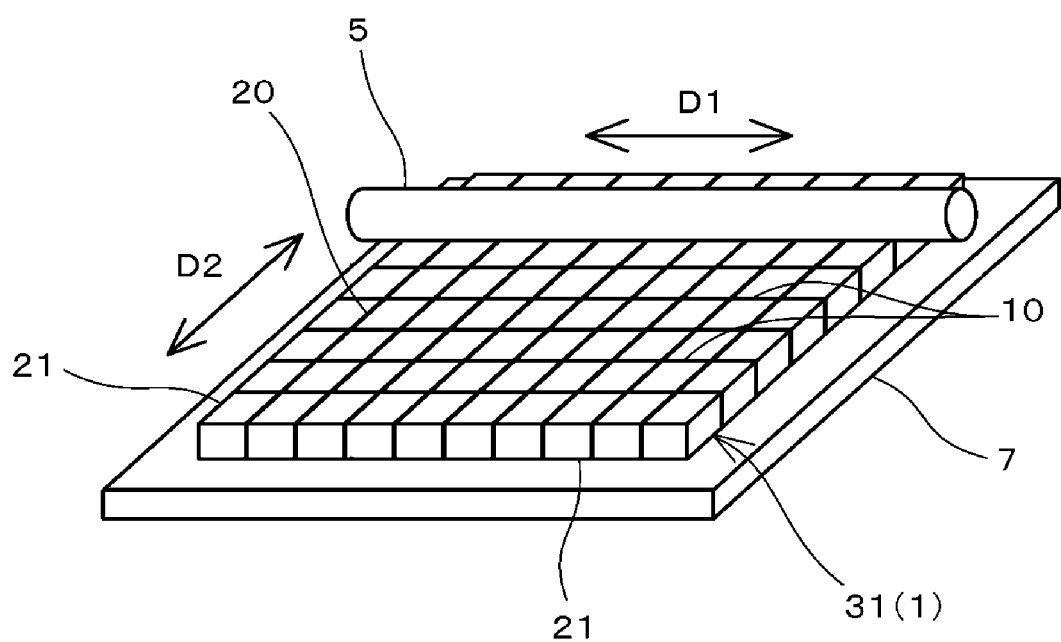
FIG. 4 illustrates a method of separating a bonded laminate between first sectional surfaces in the first preferred embodiment of the present invention.
Figure 5:
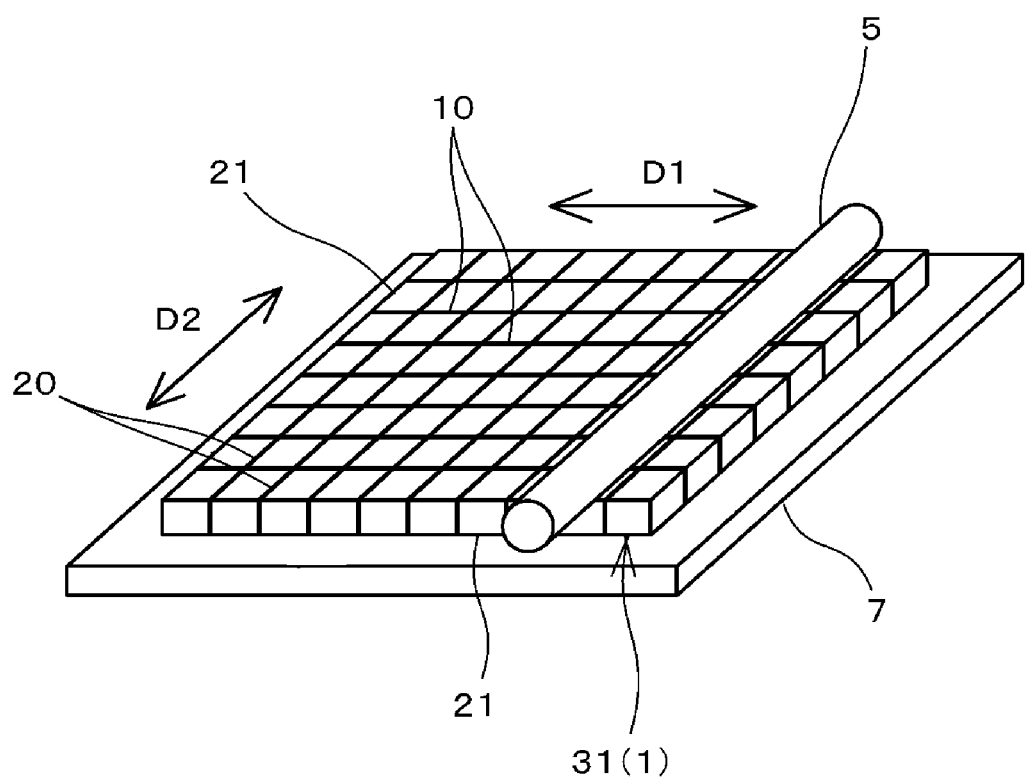
FIG. 5 illustrates a method of separating the bonded laminate between second sectional surfaces in the first preferred embodiment of the present invention.

Then, as illustrated in FIGS. 4 and 5, the bonded laminate 31, which is a set of the individual laminates 21 that have been pressure-bonded to each other, is placed on a table 7. A dividing jig 5 (such as a cylindrical bar, a rectangular or substantially rectangular bar, or a roller) is moved relative to the bonded laminate 31 along the main surface of the bonded laminate 31 by rolling the dividing jig 5 on the upper surface of the bonded laminate 31 while pressing the dividing jig 5 against the upper surface. By doing so, the bonded laminate 31, in which the first sectional surfaces 10 have been bonded to each other and the second sectional surfaces 20 have been bonded to each other, is separated between the first sectional surfaces 10 and between the second sectional surfaces 20. Thus, the individual laminates 21, which are separated from each other, can be obtained.

As illustrated in FIG. 4, the bonded laminate 31, which is placed on the table 7, is separated between the first sectional surfaces 20 by, for example, moving the dividing jig 5 in the second direction D2, which (perpendicularly or substantially perpendicularly) intersects the first direction D1, by rolling the dividing jig 5 on the upper surface of the bonded laminate 31 while pressing the dividing jig 5 against the upper surface.

Figure 6:
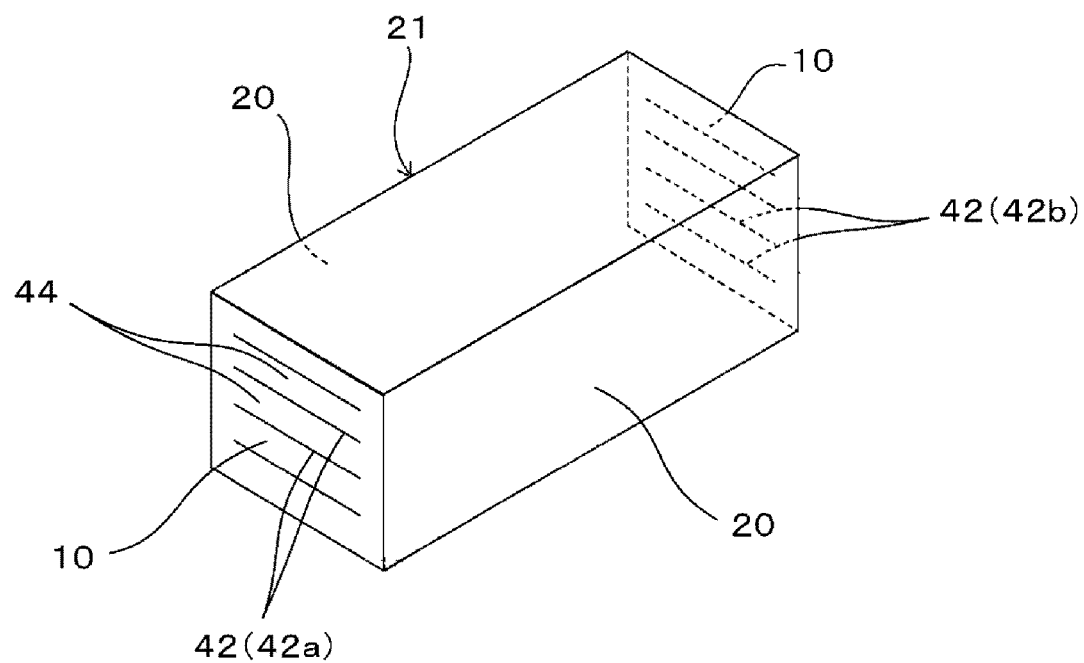
FIG. 6 illustrates one of individual laminates obtained by separating the bonded laminate in the first preferred embodiment of the present invention.

As illustrated in FIG. 5, by moving the dividing jig 5 in the first direction D1, the bonded laminate 31 is separated between the second sectional surfaces 10. FIG. 6 illustrates one of the individual laminates 21 obtained by separating the bonded laminate 31 at the first sectional surfaces 20 and the second sectional surfaces 10. In the first preferred embodiment, as illustrated in FIG. 6, the first sectional surfaces 10 are a pair of end surfaces of the individual laminate 21 to which inner electrode layers 42 (42a and 42b) that are adjacent to each other in the stacking direction extend. As illustrated in FIG. 6, the second sectional surfaces 20 are a pair of side surfaces to which none of the inner electrode layers 42 (42a and 42b), which are alternately stacked with ceramic layers 44, extends.

In the separating step, to divide the bonded laminate 31 without fail, an elastic rubber sheet may be placed on the lower surface of the bonded laminate 31. To avoid damage to the bonded laminate 31, an elastic rubber sheet may be disposed on the upper surface of the bonded laminate 31.

The bonded laminate 31 may be separated by using a sharp blade instead of a roller. The bonded laminate 31 may be separated by using another method, such as a method of separating the bonded laminate 31 by affixing an expandable tape to the bonded laminate 31 and expanding the expandable tape.

Figure 7A:
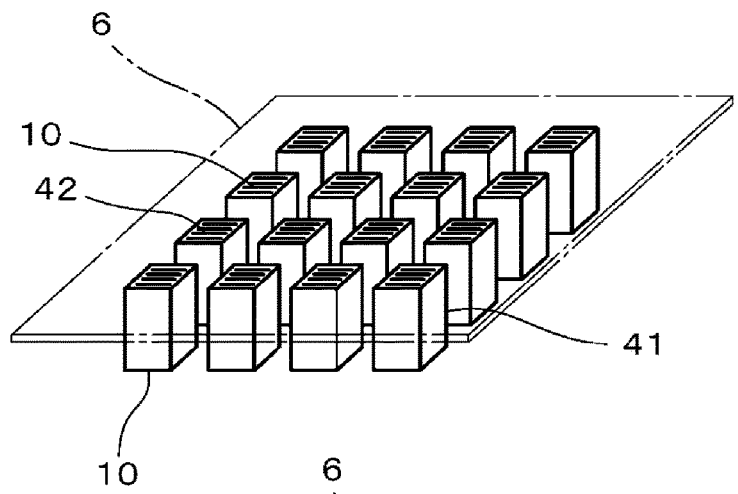
FIGS. 7A to 7C illustrate a method of applying a conductive paste, for forming outer electrodes, to end surfaces (first sectional surfaces) of individual laminates that have been fired in the first preferred embodiment of the present invention.
Figure 7B:
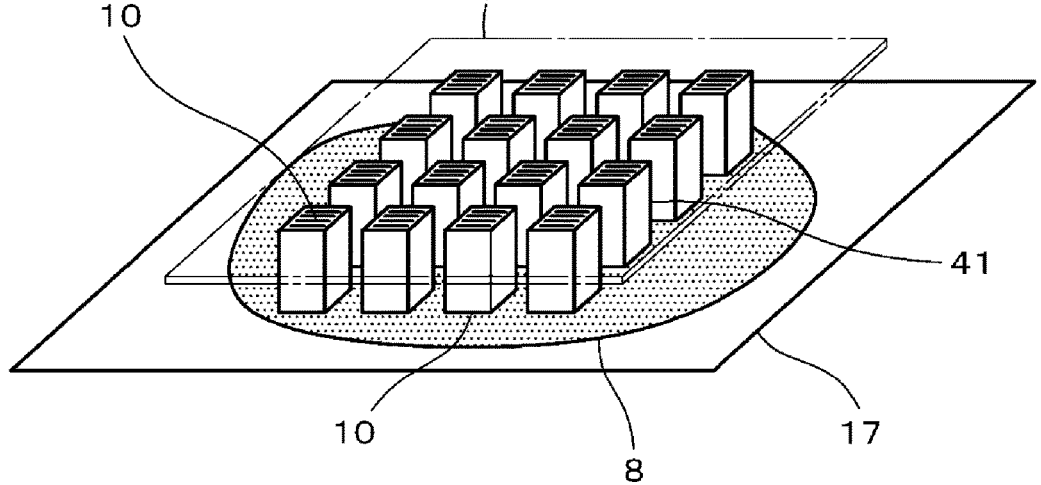
Figure 7C:
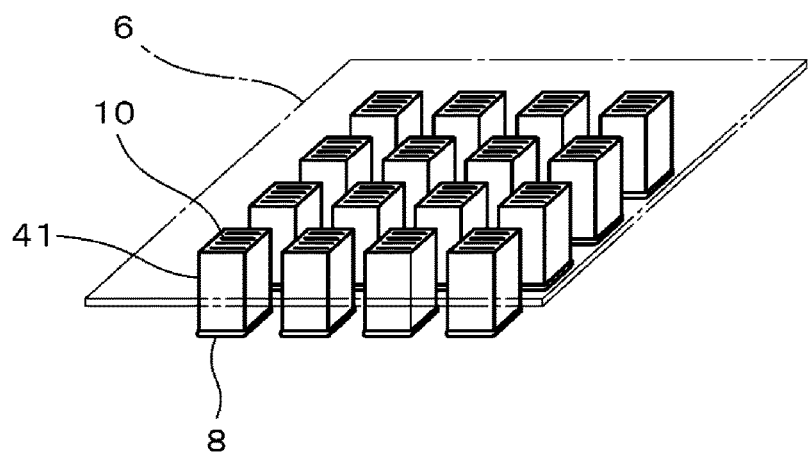

The individual laminates 21, obtained by separating the bonded laminate 31, are fired under predetermined conditions to obtain fired individual laminates (chips) 41 (see FIGS. 7A to 7C).

Then, as illustrated in FIG. 7A, the fired individual laminates (chips) 41 are attached an adhesive surface of a holding member 6. A conductive paste 8, for forming outer electrodes, is applied as a functional member to end surfaces, which are the first sectional surfaces 10 at which the inner electrode layers 42 are exposed. In the first preferred embodiment, as illustrated in FIG. 7B, the conductive paste 8, for forming outer electrodes, is applied to one of the first sectional surfaces (end surfaces) 10 of each chip 41 by dipping the first sectional surfaces (end surfaces) 10, at which the inner electrode layers 42 are exposed, in the conductive paste 8 (see FIG. 7C), which has been spread on a plate 17 to have a predetermined thickness.

Figure 8:
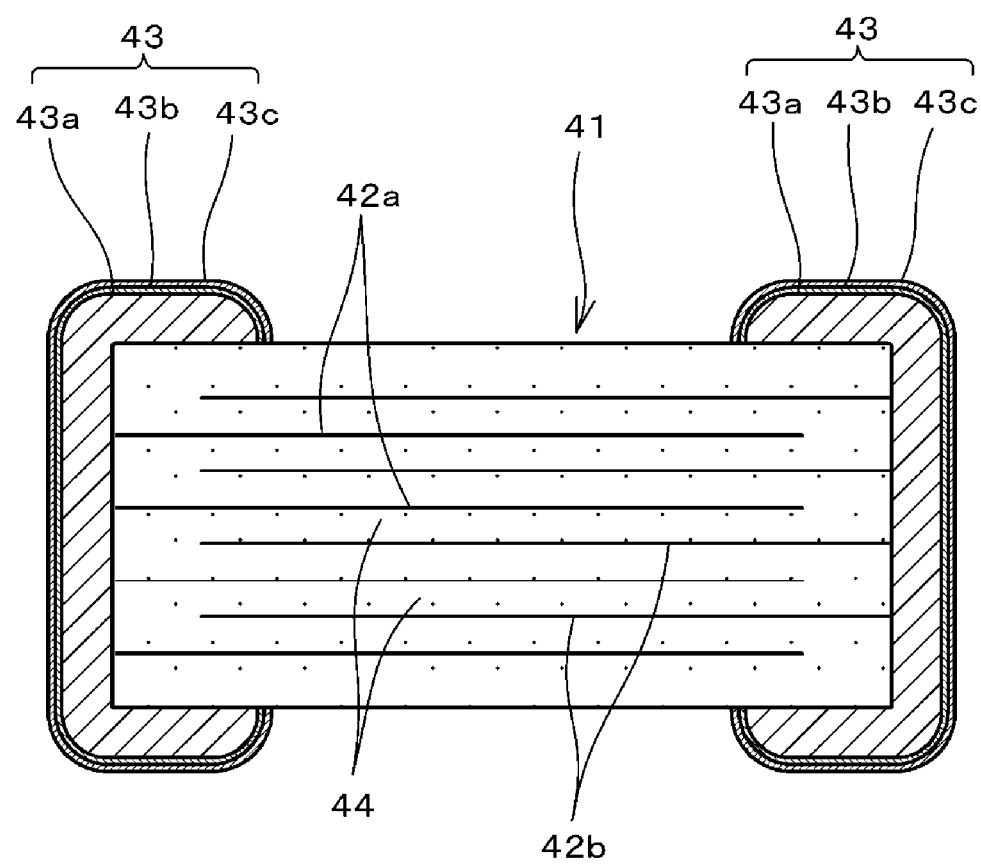
FIG. 8 illustrates a multilayer ceramic electronic component manufactured in the first preferred embodiment of the present invention.

The applied conductive paste is fired to form one of fired metal layers (underlying electrode layers) 43a of outer electrodes (see FIG. 8).

Then, the chips 41 are transferred to the holding member, the conductive paste, for forming outer electrodes, is applied to the other first sectional surface (end surface) 10 of each chip 41, and the applied conductive paste is fired to form the other fired metal layer (underlying electrode layer) 43a (see FIG. 8).

Moreover, plating layers are formed on the surfaces of the fired metal layers (underlying electrode layers). As the plating layers, for example, a nickel plating layer and a tin plating layer are successively formed.

Thus, as illustrated in FIG. 8, a multilayer ceramic electronic component (multilayer ceramic capacitor), including the inner electrode layers 42a and 42b and outer electrodes 43, is obtained. The outer electrodes 43 are disposed on end surfaces of the chip 41, in which the ceramic layers 44 are stacked, and electrically connected to the inner electrode layers 42a and 42b, which are exposed at the end surfaces of the chip 41. The outer electrodes 43 each includes a fired metal layer (underlying electrode layer) 43a, a nickel plating layer 43b, and a tin plating layer 43c.

The fired metal layers (underlying electrode layers) described above may be omitted, and the outer electrodes may be formed by directly forming plating layers on the end surfaces. Metal layers formed by sputtering may be used as outer electrodes.

The step of applying a functional member may be performed before performing the step of firing. For example, after applying the conductive paste, the laminate and the conductive paste may be fired simultaneously.

Second Preferred Embodiment

In the first preferred embodiment, the green mother laminate 1 preferably is cut in the first direction D1 in such a way that the first sectional surfaces 10 are formed; the green mother laminate 1 is cut in the second direction D2, which (perpendicularly or substantially perpendicularly) intersects the first sectional surfaces 10, in such a way that the second sectional surfaces 20 are formed; and then the green mother laminate 1 is pressed to form the bonded laminate 31. Alternatively, as in a second preferred embodiment of the present invention described below, before pressing the green mother laminate 1, the green mother laminate 1 may be cut only in the first direction D1 (in such a way that the first sectional surfaces are formed); and, after pressing the green mother laminate 1, the green mother laminate 1 may be cut in the second direction D2, which (perpendicularly or substantially perpendicularly) intersects the first sectional surfaces 10, in such a way that the second sectional surfaces 20 are formed. Hereinafter, the second preferred embodiment will be described.

A green mother laminate, which is the same as that used in the first preferred embodiment, is prepared.

Then, the green mother laminate 1 is cut only in the first direction D1 (in such a way that the first sectional surfaces are formed) in the same way as in the first preferred embodiment (see FIG. 1).

Next, in the same way as in the first preferred embodiment, a bonded laminate is formed by heating (preferably pressing and heating) cut laminates, which have been obtained by cutting the mother laminate 1 in such a way that the first sectional surfaces are formed, to bond the first sectional surfaces of the cut laminates to each other.

The bonded laminate is pressed in the same way as in the first preferred embodiment.

The bonded laminate, which has been pressed, is cut in the second direction, which (perpendicularly or substantially perpendicularly) intersects the first sectional surfaces, in such a way that the second sectional surfaces are formed.

Individual laminates are obtained by separating the bonded laminate, which has been cut in the step (5).

The individual laminates are fired in the same way as in the first preferred embodiment Fired metal layers (underlying electrode layers) are formed by applying a conductive paste, for forming outer electrodes, as a functional member to end surfaces (first sectional surfaces) of the fired individual laminates and by baking the conductive paste.

Then, in the same way as in the first preferred embodiment, plating layers are formed on the surfaces of the fired metal layers (underlying electrode layers). Thus, a multilayer ceramic electronic component (multilayer ceramic capacitor) having the structure shown in FIG. 8 is obtained.

Third Preferred Embodiment

In a method of manufacturing a multilayer ceramic electronic component according to a third preferred embodiment of the present invention, a mother laminate is separated into separated laminates so that the first sectional surfaces are exposed, and a conductive paste as a functional member is applied to the separated laminates.

First, a green mother laminate, which is the same as that used in the first preferred embodiment, is prepared.

In the same way as in the first preferred embodiment, the green mother laminate 1 is cut in the first direction D1 in such a way that the first sectional surfaces are formed, and the green mother laminate 1 is cut in the second direction, which (perpendicularly or substantially perpendicularly) intersects the first direction D1, in such a way that the second sectional surfaces are formed.

A bonded laminate is formed in the same way as in the step (3) of the first preferred embodiment.

The bonded laminate is pressed in the same way as in the step (4) of the first preferred embodiment.

Figure 9:
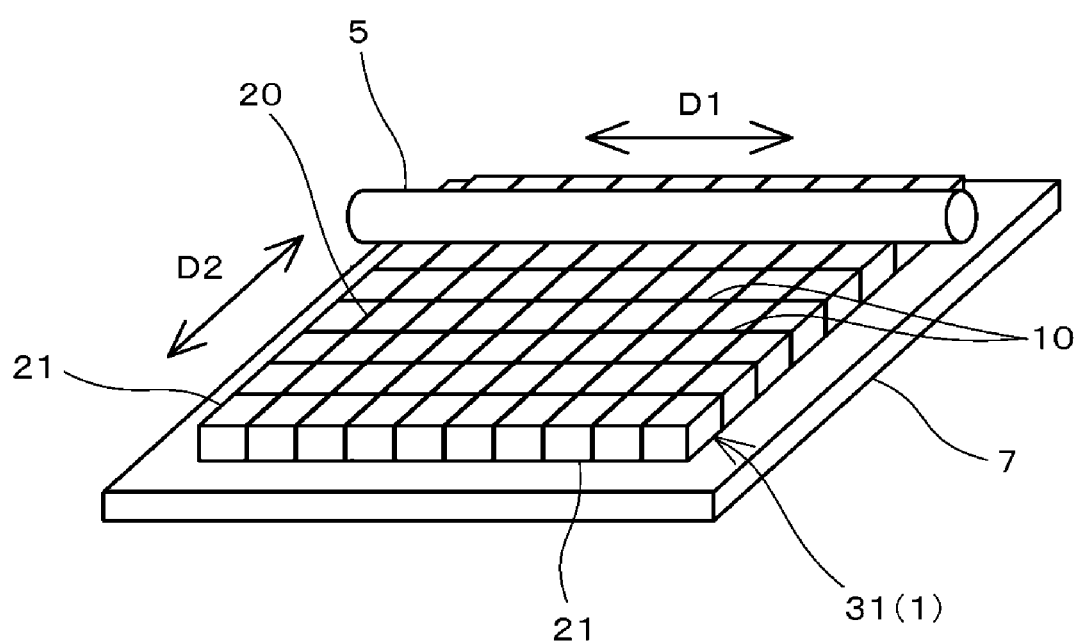
FIG. 9 illustrates a method of separating a bonded laminate between first sectional surfaces in a third preferred embodiment of the present invention.

Then, as illustrated in FIG. 9, the bonded laminate 31, which is a set of the individual laminates 21 that have been pressure-bonded, is placed on the table 7. The dividing jig 5 is moved in the second direction D2, which (perpendicularly or substantially perpendicularly) intersects the first direction D1 (along the second sectional surfaces 20), on the upper surface of the bonded laminate 31 while pressing the dividing jig 5 against the upper surface. As a result, the bonded laminate 31 is separated at the first sectional surfaces 10.

Figure 10:
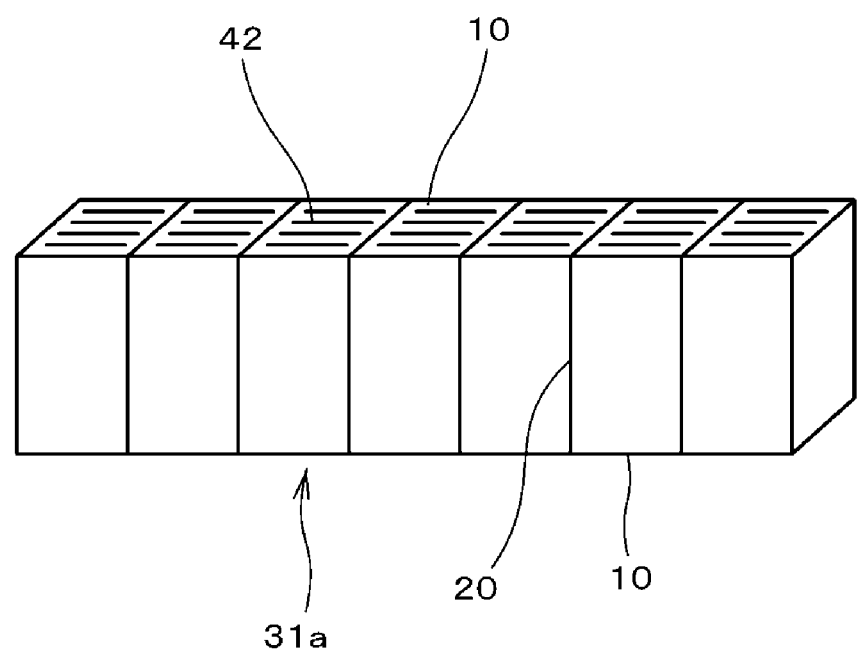
FIG. 10 illustrates one of separated laminates obtained by separating the bonded laminate between the first sectional surfaces in the third preferred embodiment of the present invention.

Thus, the bonded laminate 31 becomes separated laminates 31a, in each of which the first sectional surfaces 10 are exposed and the second sectional surfaces are bonded to each other as illustrated in FIG. 10.

The separated laminates 31a each have a structure in which each pair of the inner electrode layers 42 that are adjacent to each other in the stacking direction alternately extend to one and the other of a pair of the first sectional surfaces 10, which oppose each other.

Figure 11A:
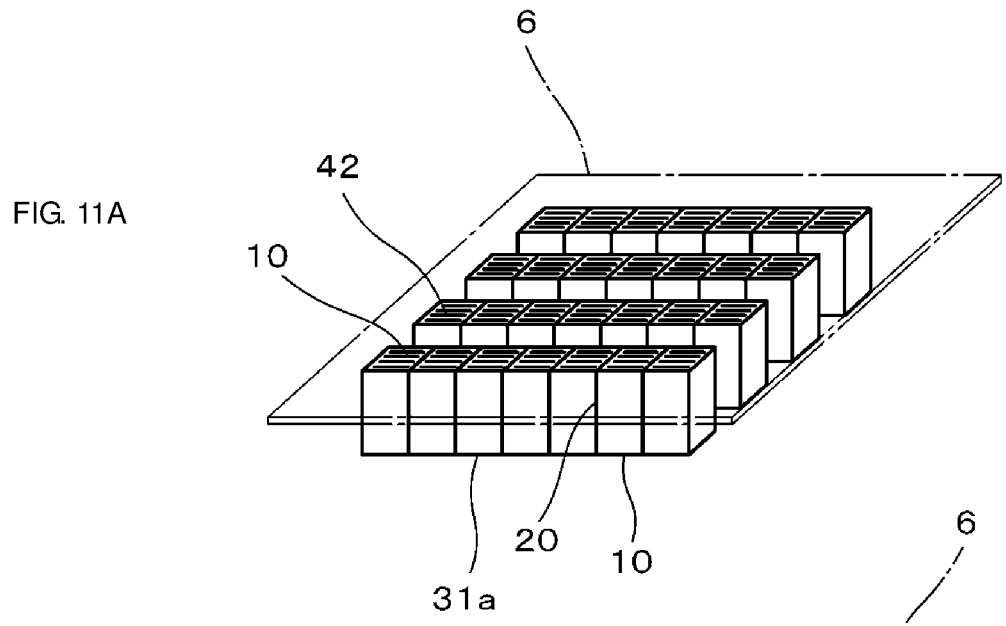
FIGS. 11A to 11C illustrate a method of applying a conductive paste, for forming outer electrodes, to end surfaces (first sectional surfaces) of the separated laminates in the third preferred embodiment of the present invention.
Figure 11B:
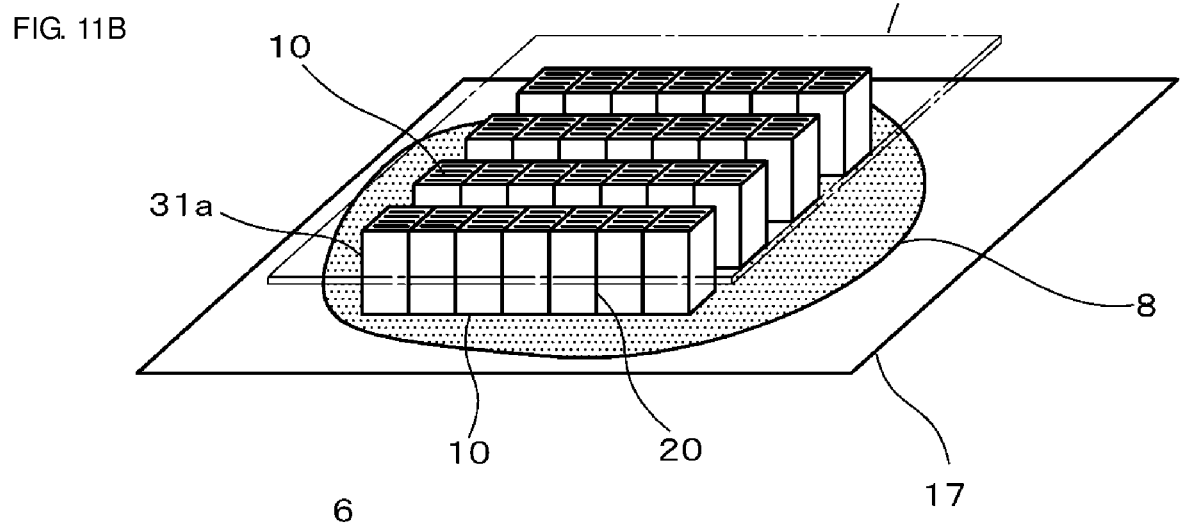
Figure 11C:
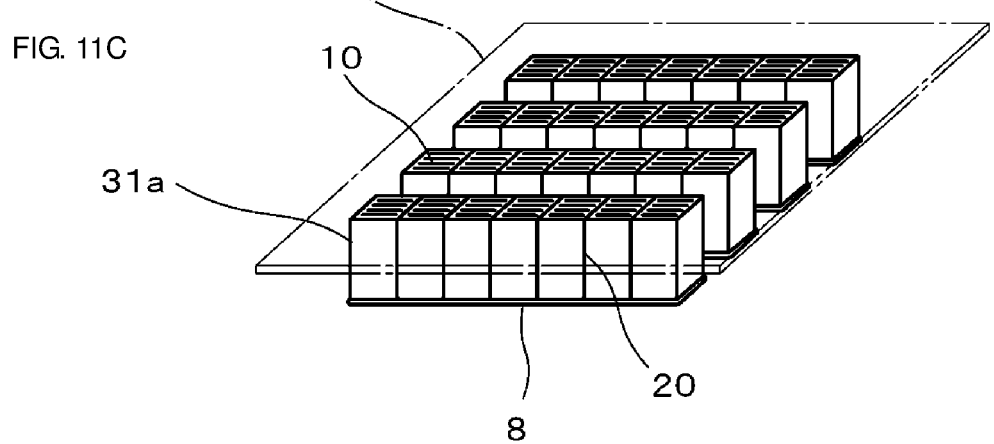

Then, as illustrated in FIG. 11A, the separated laminates 31a, which have been obtained by separating the bonded laminate 31 at the first sectional surfaces 10 and the first sectional surfaces 10 of which are exposed, are attached to an adhesive surface of the holding member 6. The conductive paste 8, for forming outer electrodes, is applied as a functional member to the first sectional surfaces 10, at which the inner electrode layers 42 are exposed. In the third preferred embodiment, as illustrated in FIG. 11B, the conductive paste 8, for forming outer electrodes, is applied to end surfaces (first sectional surfaces) 10 of the separated laminates 31a, at which the inner electrode layers 42 are exposed, by dipping the first sectional surfaces 10 in the conductive paste 8 (see FIG. 11C), which has been spread on the plate 17 to have a predetermined thickness.

The end surfaces (first sectional surfaces) 10 of the separated laminates 31a, to which the conductive paste 8 has been applied, are attached to the holding member 6. The conductive paste 8 is applied to end surfaces (first sectional surfaces) 10, which are opposite to the end surface (the first sectional surface) 10 to which the conductive paste 8 has been applied, of the separated laminate 31a.

Figure 12:
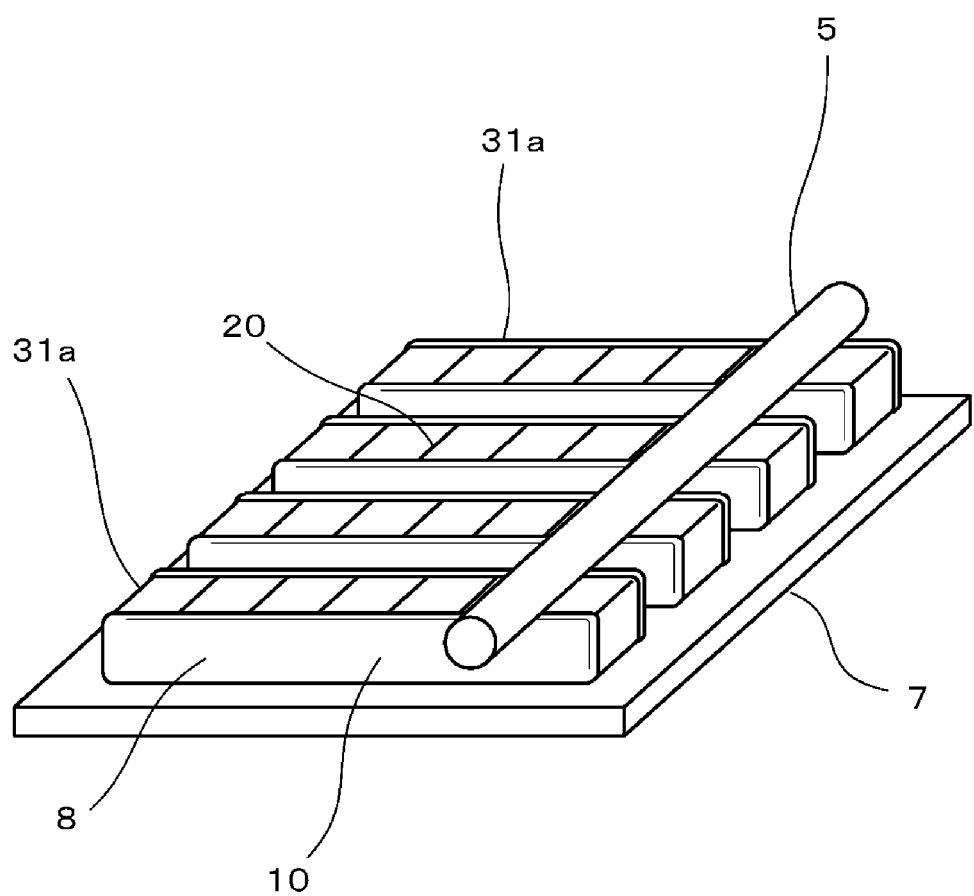
FIG. 12 illustrates a step of separating the separated laminates, to end surfaces of which the conductive paste has been applied, in the third preferred embodiment of the present invention.

Then, as illustrated in FIG. 12, the separated laminates 31a, to the end surfaces (first sectional surfaces) 10 of which the conductive paste has been applied, are placed on the table 7. The dividing jig 5 is moved in the longitudinal direction of the first sectional surfaces 10, to which the conductive paste 8 has been applied, of the separated laminates 31a while pressing the dividing jig 5 against the upper surfaces of the separated laminates 31a. By doing so, the separated laminates 31a are separated at the second sectional surfaces 20. Thus, individual laminates (chips), to the first sectional surfaces of which the conductive paste 8 has been applied, are obtained.

Next, the individual laminates (chips), which have been obtained by separating the separated laminates, are fired under predetermined conditions to sinter the ceramic layers and the inner electrode layers of the individual laminates and to bake the applied conductive paste. By doing so, fired individual laminates, each including fired metal layers (underlying electrode layers), are obtained.

Subsequently, in the same way as in the first preferred embodiment, plating layers are formed on the surfaces of the fired metal layers (underlying electrode layers). Thus, a multilayer ceramic electronic component, having a structure in which outer electrodes are disposed on both end surfaces of an individual laminate (chip), is obtained.

Instead of the fired metal layers (underlying electrode layers) described above, metal layers formed by sputtering may be used as outer electrodes.

Fourth Preferred Embodiment

In the third preferred embodiment, the green mother laminate 1 is cut in the first direction in such a way that the first sectional surfaces 10 are formed, the green mother laminate 1 is cut in the second direction, which (perpendicularly or substantially perpendicularly) intersects the first sectional surfaces 10, in such a way that the second sectional surfaces 20 are formed; the green mother laminate 1 is pressed to form the bonded laminate 31; and then the bonded laminate 31 is separated between the first sectional surfaces into the separated laminates 31a. Alternatively, as in a fourth preferred embodiment described below, before pressing the green mother laminate 1, the green mother laminate 1 may be cut only in the first direction (in such a way that the first sectional surfaces are formed); and, after pressing the green mother laminate 1, the green mother laminate 1 may be cut in the second direction, which (perpendicularly or substantially perpendicularly) intersects the first sectional surfaces 10, in such a way that the second sectional surfaces 20 are formed. Hereinafter, the fourth preferred embodiment will be described.

A green mother laminate, which is the same as that of the third preferred embodiment, is prepared.

Then, the green mother laminate 1 is cut only in the first direction D1 (in such a way that the first sectional surfaces are formed) in the same way as in the first preferred embodiment (see FIG. 1).

Next, in the same way as in the first preferred embodiment, a bonded laminate is formed by heating (preferably pressing and heating) cut laminates, which have been obtained by cutting the mother laminate 1 in such a way that the first sectional surfaces are formed, to bond the first sectional surfaces of the cut laminates to each other.

The bonded laminate is pressed in the same way as in the first preferred embodiment.

The bonded laminate, which has been pressed, is separated between the first sectional surfaces to obtain separated laminates, whose side surfaces in the longitudinal direction are the first sectional surfaces.

A conductive paste is applied as a functional member to the first sectional surfaces of the separated laminates.

The separated laminates, to the first sectional surfaces of which the conductive paste has been applied, are cut in the second direction, which (perpendicularly or substantially perpendicularly) intersects the first sectional surfaces, in such a way that the second sectional surfaces are formed. Thus, individual laminates, to the end surfaces of which the conductive paste has been applied, are obtained.

The individual laminates are fired to obtain chips, each including fired metal layers (underlying electrode layers).

Subsequently, in the same way as in the first preferred embodiment, plating layers are formed on the surfaces of the fired metal layers (underlying electrode layers). Thus, a multilayer ceramic electronic component, having a structure in which outer electrodes are disposed on both end surfaces of the individual laminate (chip), is obtained.

Fifth Preferred Embodiment

Figure 13:
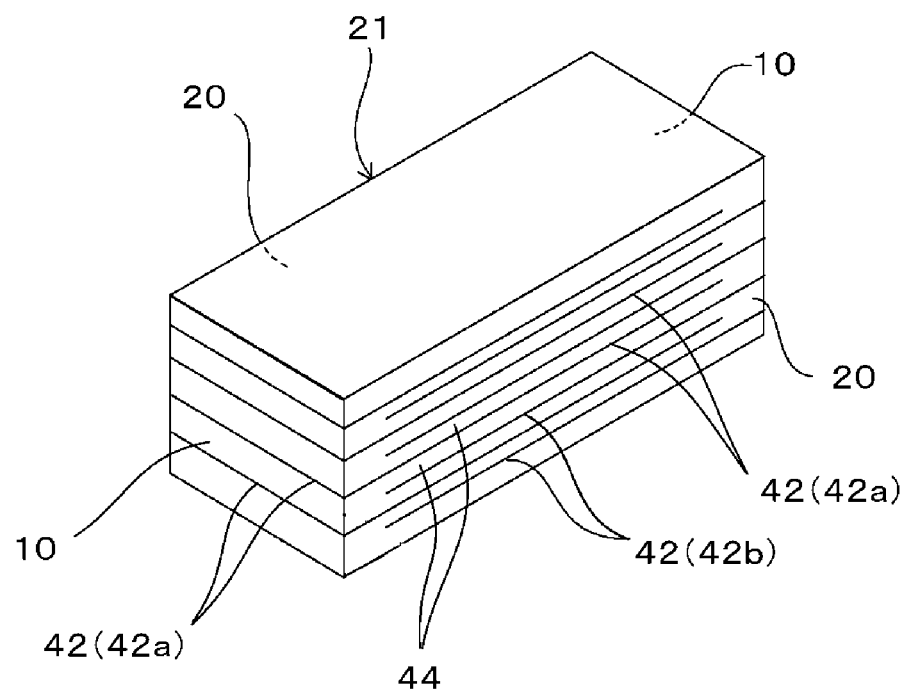
FIG. 13 illustrates the structure of an individual laminate obtained in a fifth preferred embodiment of the present invention.

In a method of manufacturing a multilayer ceramic electronic component (multilayer ceramic capacitor) according to a fifth preferred embodiment of the present invention, a mother laminate is cut and separated to obtain individual laminates 21 each having the structure shown in FIG. 13. As illustrated in FIG. 13, in the individual laminate 21, the inner electrode layers 42a and 42b, which are adjacent to each other in the stacking direction, respectively extend to one and the other of a pair of end surfaces (first sectional surfaces) 10 that oppose each other. Moreover, all the inner electrode layers 42a and 42b, which are alternately stacked with the ceramic layers 44, are exposed at a pair of side surfaces (second sectional surfaces 20) that oppose each other.

A mother laminate, from which the individual laminates having the structure shown in FIG. 13 can be obtained by being cut, can be manufactured, for example, as follows. Ceramic green sheets, in each of which strip-shaped inner electrode patterns are arranged at a predetermined pitch, are stacked in such a way that the positions of the inner electrode patterns are alternately displaced from each other layer by layer in opposite directions perpendicular to the longitudinal directions of the inner electrode patterns.

A green mother laminate, from which the individual laminates 21 each having the structure shown in FIG. 13 can be obtained by being cut, is prepared.

The green mother laminate is cut perpendicularly or substantially perpendicularly to the main surface and in the first direction in such a way that the first sectional surfaces are formed.

Next, the mother laminate, which has been cut, is cut perpendicularly or substantially perpendicularly to the main surface and in the second direction, which (perpendicularly or substantially perpendicularly) intersects the first sectional surfaces, in such a way that the second sectional surfaces are formed. Thus, the mother laminate becomes a set of individual laminates 21, each having the structure illustrated in FIG. 13. That is, the inner electrode layers 42a and 42b, which are adjacent to each other in the stacking direction, respectively extend to one and the other of a pair of end surfaces (first sectional surfaces) 10, and all the inner electrode layers 42a and 42b, which are alternately stacked with the ceramic layers 44, are exposed at a pair of side surfaces (second sectional surfaces 20).

The set of the individual laminates is pressed (preferably, pressed and heated), while maintaining the arrangement of the individual laminates, to bond the first sectional surfaces to each other and the second sectional surfaces of the individual laminates to each other.

The bonded laminate is pressed in the same way as in the first preferred embodiment.

In the same way as in the first preferred embodiment, the bonded laminate is separated between the first sectional surfaces and between the second sectional surfaces to obtain the individual laminates 21, each having the structure shown in FIG. 13.

Figure 14:
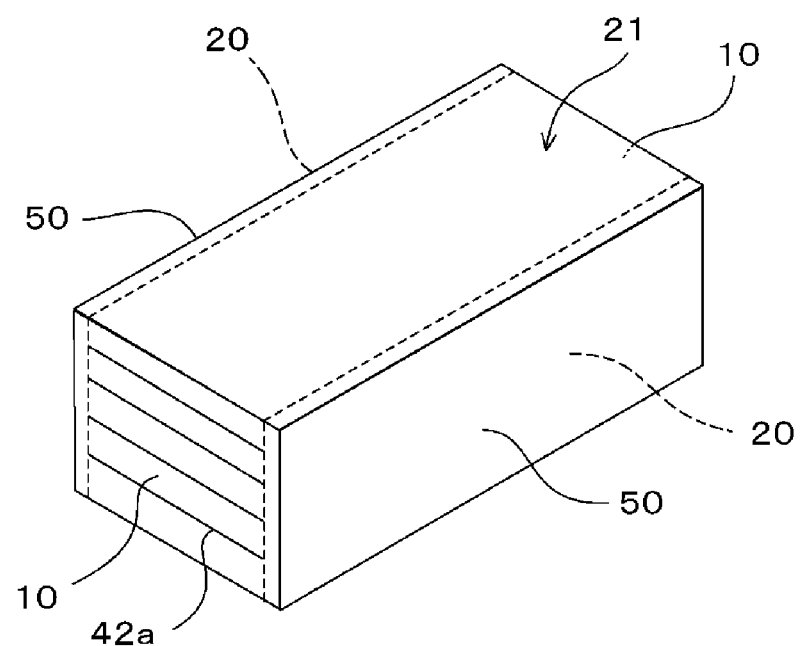
FIG. 14 illustrates the individual laminate obtained in the fifth preferred embodiment of the present invention in a state in which protective layers, made of an insulating material, have been applied as functional members to second sectional surfaces, at which inner electrode layers are exposed, of the individual laminate.

Next, referring to FIG. 14, protective layers 50, made of an insulating material, are applied as functional members to the second sectional surfaces 20 of the individual laminates 21, at which all the inner electrode layers 42a and 42b are exposed (see FIG. 13). In the fifth preferred embodiment, preferably, the functional members, which are the protective layers 50, are made of a material including a ceramic material (such as barium titanate) of the ceramic layers 44 of the individual laminate 21. The protective layers 50 function to ensure the reliability of insulation by providing so-called side gaps, between side portions of the inner electrode layers and side surfaces of a chip (multilayer ceramic electronic component).

Figure 15A:
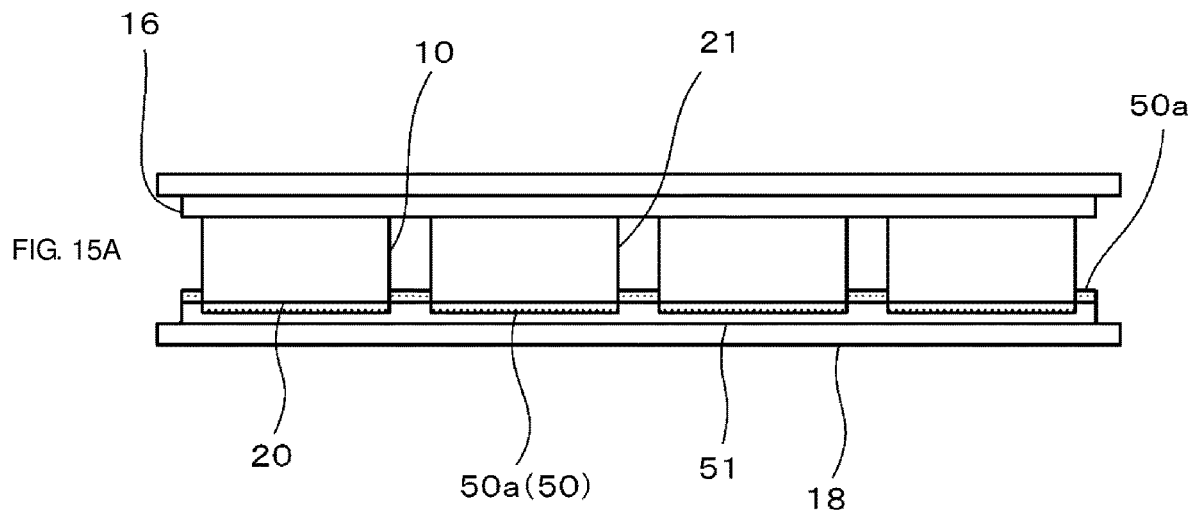
FIGS. 15A and 15B illustrate individual laminates, each shown in FIG. 14, in a state in which the protective layers are being applied as functional members to the second sectional surfaces, at which inner electrode layers are exposed, of the individual laminates.
Figure 15B:
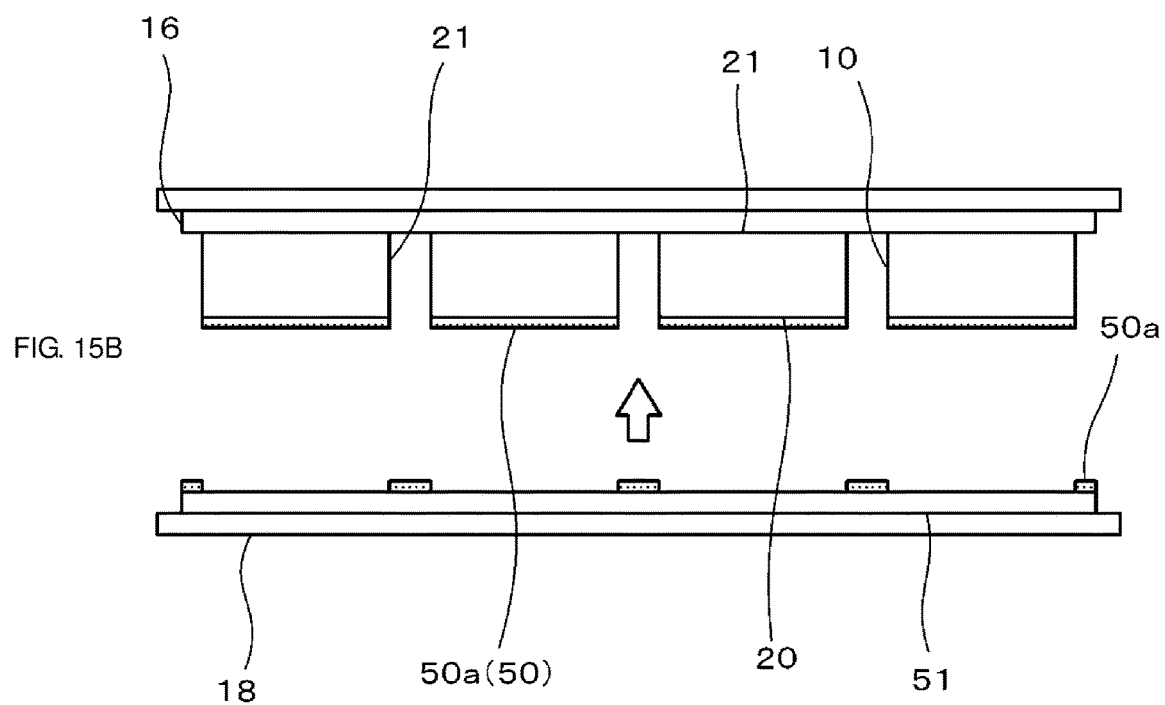

As illustrated FIGS. 15A and 15B, the protective layers 50 are applied to the second sectional surfaces 20 as follows. First, as illustrated in FIG. 15A, the individual laminates 21 are attached to an adhesive surface of a holding member 16. Second, the side surfaces 20, which are the second sectional surfaces at which the inner electrode layers 42a and 42b are exposed, are pressed against green ceramic sheets 50a, which are placed on an elastic rubber sheet 51 on a base plate 18. The green ceramic sheets 50a, which are to become the protective layers 50, are each made by forming ceramic slurry (barium-titanate-based ceramic slurry) into a sheet shape. Third, as illustrated in FIG. 15B, the individual laminates 21 are separated from the elastic rubber sheet 51, thus applying the ceramic sheets 50a, which are to become the protective layers 50, to the side surfaces (second sectional surfaces 20). Fourth, the protective layers 50 (ceramic sheets 50a) are applied to the opposite side surfaces (second sectional surfaces 20) in the same way as described above.

Then, the individual laminates 21, to which the protective layers 50 have been applied, are fired under predetermined conditions to sinter the individual laminates 21.

Figure 16:
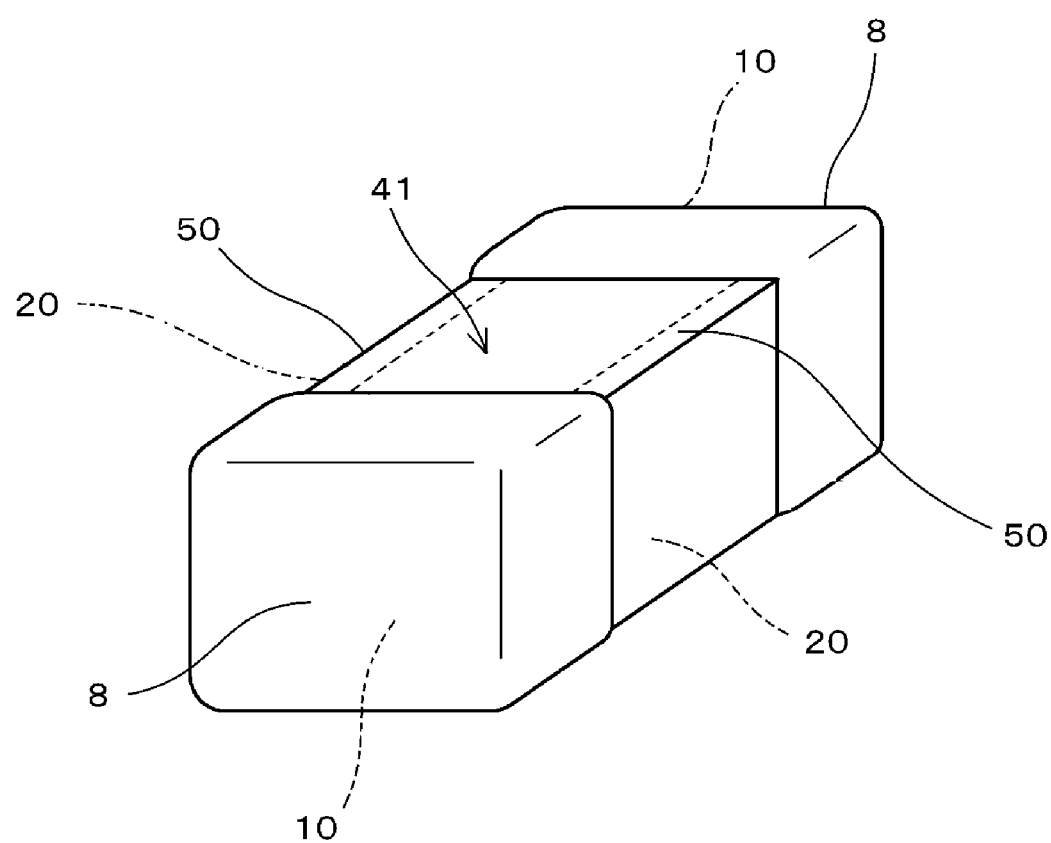
FIG. 16 illustrates one of the individual laminates shown in FIGS. 15A and 15B in a state in which a conductive paste, for forming outer electrodes, has been applied to first sectional surfaces.

Next, as illustrated in FIG. 16, the conductive paste 8, for forming outer electrodes, is applied as a functional member to each of the end surfaces (first sectional surfaces) 10, to which the inner electrode layers 42a and 42b (see FIGS. 13 and 14) extend, of the fired individual laminate 41 (chip). For example, the conductive paste 8 can be applied to each of the first sectional surfaces 10, which are end surfaces of the chip 41, by using a method described in the step (7) of the first preferred embodiment.

Subsequently, the conductive paste is baked to obtain a chip including fired metal layers (underlying electrode layers). Subsequently, in the same way as in the first preferred embodiment, plating layers are formed on the surfaces of the fire metal layers (underlying electrode layers).

Thus, it is possible to obtain a multilayer ceramic electronic component (multilayer ceramic capacitor) having high reliability, in which the outer electrodes are disposed on both end surfaces (first sectional surfaces) of an individual laminate (chip) and the protective layers are disposed on the second sectional surfaces (side surfaces) of the individual laminate.

Sixth Preferred Embodiment

In the fifth preferred embodiment, the green mother laminate 1 preferably is cut in the first direction in such a way that the first sectional surfaces 10 are formed; the green mother laminate 1 is cut in the second direction, which (perpendicularly or substantially perpendicularly) intersects the first sectional surfaces 10, in such a way that the second sectional surfaces 20 are formed; and then the green mother laminate 1 is pressed to form the bonded laminate 31. Alternatively, as in a sixth preferred embodiment described below, the green mother laminate 1 may be pressed in a state in which the green mother laminate 1 has been cut only in the first direction in which the first sectional surfaces are formed; the green mother laminate 1 may be separated between the first sectional surfaces; and then the green mother laminate 1 may be cut in the second direction, which (perpendicularly or substantially perpendicularly) intersects the first sectional surfaces, in such a way that the second sectional surfaces are formed, to divide the green mother laminate into individual laminates. Hereinafter, the fifth preferred embodiment will be described.

A green mother laminate, having a structure the same as that of the fifth preferred embodiment, is prepared.

Then, the green mother laminate is cut only in the first direction D1 (in such a way that the first sectional surfaces are formed).

Next, a bonded laminate is formed by heating (preferably, pressing and heating) cut laminates, which have been obtained by cutting the mother laminate in such a way that the first sectional surface are formed, to bond the first sectional surfaces to each other and then by pressing the cut laminates.

The bonded laminate, which has been pressed, is separated between the first sectional surfaces into a plurality of separated laminates, in each of which the first sectional surfaces are exposed.

The separated laminates are cut in the second direction, which (perpendicularly or substantially perpendicularly) intersects the first sectional surfaces, in such a way that the second sectional surfaces are formed to divide the separated laminates into individual laminates.

Subsequently, the step of applying functional members (protective layers), the step of firing, the step of applying functional members (outer electrodes) of the fifth preferred embodiment are performed in the same way as in the fifth preferred embodiment. As necessary, plating layers are formed on the surfaces of the fired metal layers (underlying electrode layers). Thus, it is possible to obtain a multilayer ceramic electronic component (multilayer ceramic capacitor) having high reliability, in which the outer electrodes are disposed on both end surfaces (first sectional surfaces) of an individual laminate (chip) and the protective layers are disposed on the second sectional surfaces (side surfaces) of the individual laminate.

Seventh Preferred Embodiment

Also in a method of manufacturing a multilayer ceramic electronic component (multilayer ceramic capacitor) according to a seventh preferred embodiment of the present invention, a mother laminate is separated into individual laminates 21 each having the structure shown in FIG. 13.

A green mother laminate, having a structure the same as that of the fifth preferred embodiment, is prepared.

The green mother laminate is cut perpendicularly or substantially perpendicularly to the main surface and in the first direction in such a way that the first sectional surfaces are formed.

Next, the mother laminate, which has been cut, is cut perpendicularly or substantially perpendicularly to the main surface and in the second direction, which (perpendicularly or substantially perpendicularly) intersects the first sectional surfaces. Thus, the mother laminate is separated into individual laminates, each having the first and second sectional surfaces.

A set of the individual laminates is heated (preferably, pressed and heated), while maintaining the arrangement of the individual laminates, to bond the first sectional surfaces of the individual laminates to each other and the second sectional surface of the induvial laminates to each other.

The bonded laminate is pressed in the same way as in the first preferred embodiment.

Figure 17:
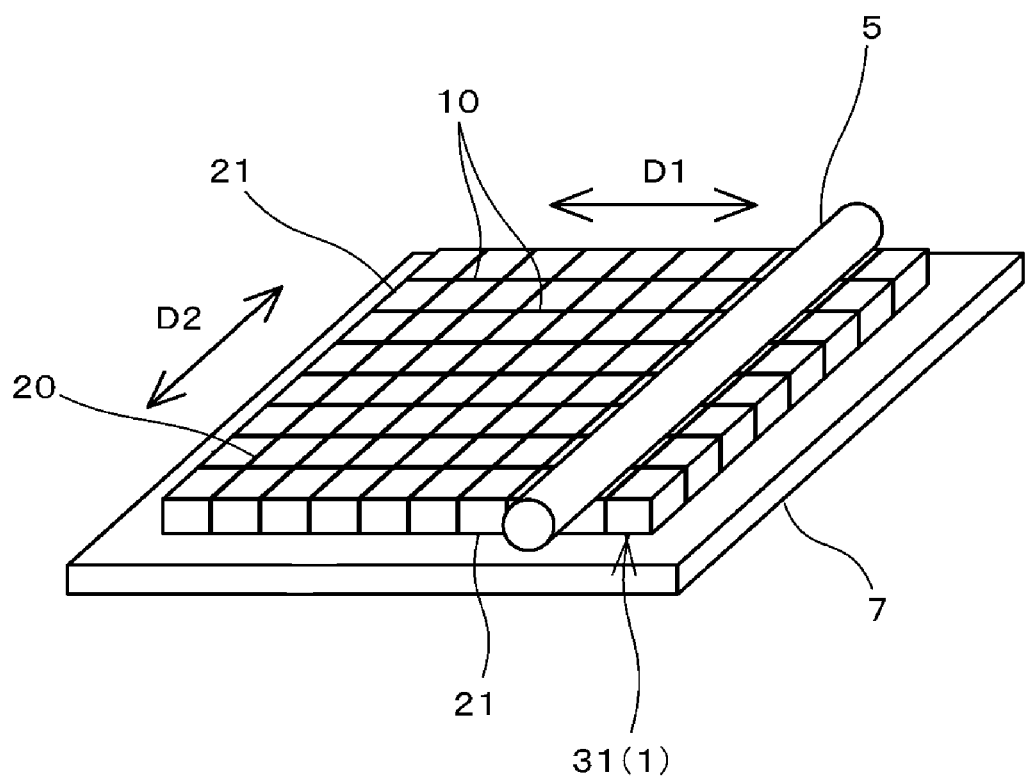
FIG. 17 illustrates a method of separating a bonded laminate in a seventh preferred embodiment of the present invention.
Figure 18:
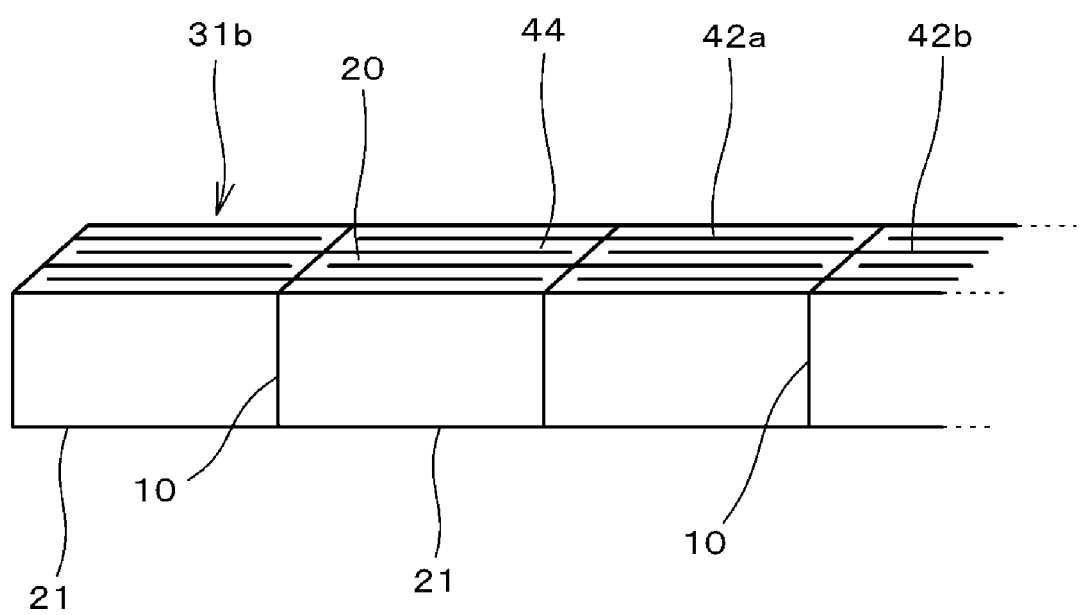
FIG. 18 illustrates one of separated laminates obtained by separating the bonded laminate in the seventh preferred embodiment of the present invention.

Then, as illustrated in FIG. 17, the bonded laminate 31, which is a set of the individual laminates 21 that have been pressure-bonded, is placed on the table 7. The dividing jig 5 is moved in the first direction D1 (along the first sectional surfaces 10) on the upper surface of the bonded laminate 31 while pressing the dividing jig 5 against the upper surface to divide the bonded laminate 31 at the second sectional surfaces 20. Thus, separated laminates 31b, the second sectional surfaces 20 of which are exposed as illustrated in FIG. 18, are obtained. As illustrated in FIG. 18, side portions of the inner electrode layers 42 (42a and 42b) and the ceramic layers are exposed at the second sectional surfaces 20. In the separated laminates 31b, the first sectional surfaces 10 are bonded to each other.

Figure 19:
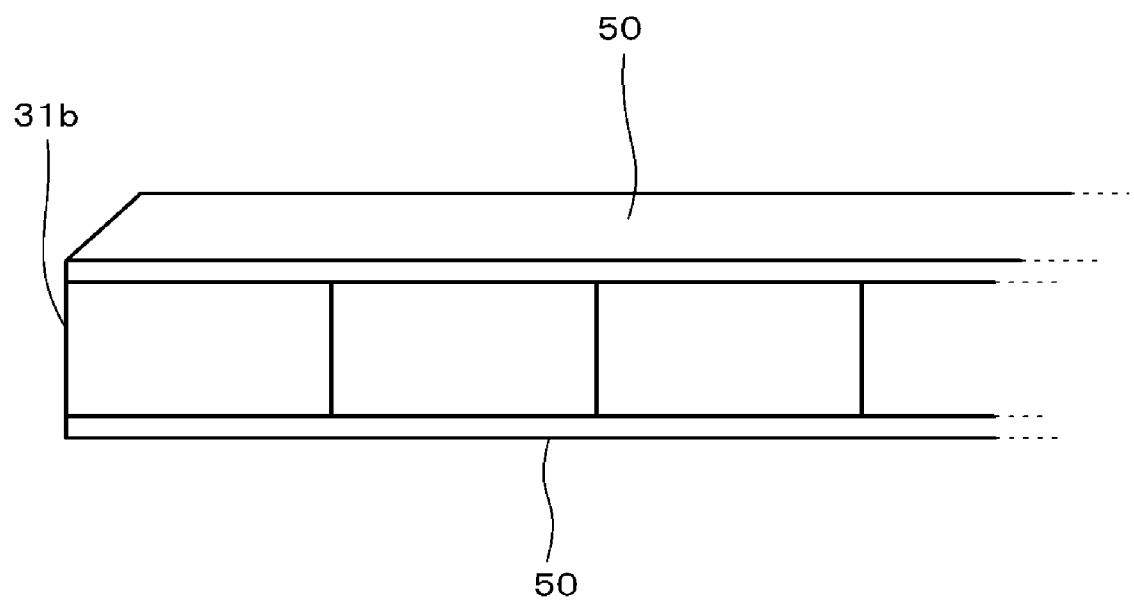
FIG. 19 illustrates the separated laminate shown in FIG. 18 in a state in which protective layers, made of an insulating material, have been applied to the second sectional surfaces.

Next, referring to FIG. 19, protective layers 50, which are made of an insulating material (ceramic slurry), are applied as functional members to the second sectional surfaces of the separated laminates 31b, at which all the inner electrode layers 42a and 42b are exposed (see FIG. 18).

By separating the separated laminate at the first sectional surfaces, individual laminates, each including protective layers, are obtained. The separated laminate can be separated by, for example, moving a roller in a predetermined direction (that (perpendicularly or substantially perpendicularly) intersects the first sectional surfaces) while pressing the roller against the upper surface of the separated laminate.

Then, the individual laminates, in each of which the protective layers have been formed, are fired under predetermined conditions to obtain fired individual laminates (chips).

Next, a conductive paste, for forming outer electrodes, is applied as a functional member to end surfaces (first sectional surfaces), to which the inner electrode layers extend, of the fired individual laminates. The conductive paste can be applied, for example, by using the method described in the step (7) of the first preferred embodiment.

Fired metal layers (underlying electrode layers) are formed by baking the conductive paste, and, as necessary, plating layers are formed on surfaces of the fire metal layers. Thus, it is possible to obtain a multilayer ceramic electronic component (multilayer ceramic capacitor) having high reliability, in which protective layers (insulating layers) are formed on the side surfaces.

Eighth Preferred Embodiment

In the seventh preferred embodiment, as illustrated in FIG. 13, the green mother laminate 1 preferably is cut in the first direction in such a way that the first sectional surfaces 10 are formed; the green mother laminate 1 is cut in the second direction, which (perpendicularly or substantially perpendicularly) intersects the first sectional surfaces 10, in such a way that the second sectional surfaces 20 are formed; and then the green mother laminate 1 is bonded and pressed to form the bonded laminate 31. Alternatively, as in an eighth preferred embodiment described below, the green mother laminate 1 may be pressed in a state in which the green mother laminate 1 has been cut only in the first direction D1 in which first sectional surfaces are formed, and then the green mother laminate 1 may be separated into individual laminates by cutting the green mother laminate 1 in the second direction, which (perpendicularly or substantially perpendicularly) intersects the first sectional surfaces, in such a way that the second sectional surfaces are formed. Hereinafter, the eighth preferred embodiment will be described.

A green mother laminate, which is the same as that used in the fifth preferred embodiment, is prepared.

Then, the green mother laminate is cut only in the first direction D1 in such a way that the first sectional surfaces are formed.

Next, a bonded laminate is formed by heating (preferably, pressing and heating) cut laminates, which have been obtained by cutting the mother laminate in such a way that the first sectional surfaces are formed, to bond the first sectional surfaces to each other and then by pressing the cut laminates.

The bonded laminate is cut in the second direction, which (perpendicularly or substantially perpendicularly) intersects the first direction D1, in such a way that the second sectional surfaces are formed to divide the bonded laminate into a plurality of separated laminates, in each of which second sectional surfaces are exposed. In each of the separated laminates, the first sectional surfaces are bonded to each other.

Protective layers are applied as functional members to the second sectional surfaces of the separated laminates by applying an insulating material (ceramic slurry) to the second sectional surfaces. The protective layers can be applied by using the method of applying functional members (protective layers) described in the step (6) of the fifth preferred embodiment.

The bonded laminate is separated into individual laminates, in each of which protective layers 50 have been applied to the second sectional surfaces, by separating the separated laminate at the first sectional surfaces by moving the dividing jig 5 in the second direction, which (perpendicularly or substantially perpendicularly) intersects the first direction D1, while pressing the dividing jig 5 against the upper surface of the separated laminate.

Then, the individual laminates, in each of which the protective layers have been formed, are fired under predetermined conditions to obtain fired individual laminates (chips).

Next, a conductive paste, for forming outer electrodes, is applied as a functional member to end surfaces (first sectional surfaces), to which the inner electrode layers extend, of the fired individual laminates. The conductive paste can be applied, for example, by using the method described in the step (7) of the first preferred embodiment.

Fired metal layers (underlying electrode layers) are formed by baking the conductive paste, and, as necessary, plating layers are formed on surfaces of the fire metal layers. Thus, it is possible to obtain a multilayer ceramic electronic component (multilayer ceramic capacitor) having high reliability, in which protective layers (insulating layers) are formed on the side surfaces.

In each of the preferred embodiments described above, the first sectional surfaces are end surfaces of the individual laminate, and the second sectional surfaces are side surfaces of the individual laminate. Alternatively, the first sectional surfaces may be the side surfaces of the individual laminate, and the second sectional surfaces may be the end surfaces of the individual laminate.

In each of the preferred embodiments described above, a method of forming a multilayer ceramic capacitor is described as an example. However, a method according to various preferred embodiments of the present invention can be used to manufacture not only a multilayer ceramic capacitor but also any multilayer ceramic electronic component having a structure in which inner electrode layers are stacked with ceramic layers interposed therebetween, such as an inductor, a thermistor, or a piezoelectric component.

Also in other respects, the present invention is not limited to the preferred embodiments described above, which may be modified in various ways within the spirit and scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method of manufacturing a multilayer ceramic electronic component, the method comprising:
   a bonded laminate forming step including:
      cutting a green mother laminate, in which ceramic layers and inner electrode layers are stacked, to form first sectional surfaces that intersect a main surface of the green mother laminate; and after cutting, pressing the cut green mother laminate in a state in which the first sectional surfaces are in contact with each other to obtain the bonded laminate in which the first sectional surfaces are bonded to each other; and a separating step of separating the bonded laminate between the first sectional surfaces, which have been bonded to each other, to obtain separated laminates.

2. The method according to claim 1, further comprising:

after performing the bonded laminate forming step, cutting the bonded laminate to form second sectional surfaces that intersect the main surface and the first sectional surfaces.

3. The method according to claim 2, wherein, in the separating step, the bonded laminate is separated either or both of between the first sectional surfaces and between the second sectional surfaces by moving a dividing jig relative to the bonded laminate along a main surface of the bonded laminate while pressing the dividing jig against the main surface of the bonded laminate.

4. The method according to claim 1, wherein the bonded laminate forming step further includes:

after cutting the green mother laminate to form the first sectional surfaces and before pressing the green mother laminate, cutting the green mother laminate to form second sectional surfaces that intersect the main surface and the first sectional surfaces; and pressing the cut green mother laminate to obtain the bonded laminates in which the first sectional surfaces are bonded to each other and the second sectional surfaces are bonded to each other.

5. The method according to claim 1, wherein, in the separating step, the bonded laminate is separated between the first sectional surfaces, which have been bonded to each other, by moving a dividing jig relative to the bonded laminate along a main surface of the bonded laminate while pressing the dividing jig against the main surface of the bonded laminate.

6. The method according to claim 1, further comprising:

a step of applying a functional member to either or both of the first sectional surfaces and second sectional surfaces intersecting the main surface of the mother laminate and the first sectional surfaces, of the laminates obtained by separating the bonded laminate in the separating step.

7. The method according to claim 6, wherein the laminates obtained in the separating step each include inner electrode layers and ceramic layers that are alternately stacked;

one of each pair of the inner electrode layers that are adjacent to each other in a stacking direction is exposed at one of a pair of the first sectional surfaces that oppose each other;

the other of the pair of the inner electrode layers that are adjacent to each other in the stacking direction is exposed at the other of the pair of the first sectional surfaces; and the method further includes a step of applying an electrode material as the functional member to the pair of the first sectional surfaces.

8. The method according to claim 6, wherein the laminates obtained in the separating step each include inner electrode layers and ceramic layers that are alternately stacked;

one of each pair of the inner electrode layers that are adjacent to each other in a stacking direction is exposed at one of a pair of the first sectional surfaces that oppose each other;

the other of the pair of inner electrode layers that are adjacent to each other in the stacking direction is exposed at the other of the pair of the first sectional surfaces; and all the inner electrode layers that are stacked are exposed at each of a pair of the second sectional surfaces that intersect the first sectional surfaces and that oppose each other; and the method further includes a step of applying an insulating material as the functional member to the second sectional surfaces of the laminates.

9. The method according to claim 6, wherein the laminates obtained in the separating step each include inner electrode layers and ceramic layers that are alternately stacked;

the inner electrode layers are not exposed at the first sectional surfaces;

one of each pair of the inner electrode layers that are adjacent to each other in a stacking direction is exposed at one of a pair of the second sectional surfaces that oppose each other;

the other of the pair of the inner electrode layers that are adjacent to each other in the stacking direction is exposed at the other of the pair of the second sectional surfaces; and the method further includes a step of applying an electrode material as the functional member to the second sectional surfaces of the laminates.

* * * * *